(12) United States Patent
Fukuzumi et al.

(10) Patent No.: US 7,982,260 B2
(45) Date of Patent: Jul. 19, 2011

(54) SEMICONDUCTOR MEMORY DEVICE

(75) Inventors: Yoshiaki Fukuzumi, Yokohama (JP);
Hideaki Aochi, Kawasaki (JP); Ryota Katsumata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 12/013,672

(22) Filed: Jan. 14, 2008

(65) Prior Publication Data
US 2008/0173933 A1 Jul. 24, 2008

(30) Foreign Application Priority Data

Jan. 15, 2007 (JP) ................................. 2007-006183

(51) Int. Cl.
*H01L 27/115* (2006.01)
*H01L 29/792* (2006.01)

(52) U.S. Cl. .................. 257/324; 257/326; 257/329

(58) Field of Classification Search ............. 257/E21.41, 257/324, 326, 329, E29.301, E29.264, E29.129, 257/E29.309, E27.103, E29.262, E29.302, 257/368, E29.226, 302, 306, 330, E27.062, 257/E27.091, E27.096, E27.099, E27.112
See application file for complete search history.

(56) References Cited

U.S. PATENT DOCUMENTS

| | | | | |
|---|---|---|---|---|
| 4,745,079 A * | 5/1988 | Pfiester | .................. | 438/306 |
| 5,308,778 A * | 5/1994 | Fitch et al. | .................. | 438/128 |
| 6,383,860 B2 | 5/2002 | Maeda et al. | | |
| 6,744,101 B2 * | 6/2004 | Long et al. | .................. | 257/368 |
| 6,841,438 B2 | 1/2005 | Bissey et al. | | |
| 6,909,141 B2 | 6/2005 | Roesner et al. | | |
| 2005/0063237 A1* | 3/2005 | Masuoka et al. | ............. | 365/222 |
| 2006/0244079 A1* | 11/2006 | Wang et al. | .................. | 257/407 |
| 2008/0089128 A1* | 4/2008 | Mokhlesi et al. | ........ | 365/185.17 |
| 2008/0117677 A1* | 5/2008 | Ou et al. | .................. | 365/185.03 |
| 2008/0308870 A1* | 12/2008 | Faul et al. | .................. | 257/368 |

OTHER PUBLICATIONS

U.S. Appl. No. 12/392,636, filed Feb. 25, 2009, Ishiduki et al.
U.S. Appl. No. 12/169,371, filed Jul. 8, 2008, Matsuoka et al.
U.S. Appl.No. 12/694,677, filed Jan. 27, 2010, Fukuzumi et al.

* cited by examiner

*Primary Examiner* — Ken A Parker
*Assistant Examiner* — David Spalla
(74) *Attorney, Agent, or Firm* — Oblon, Spivak, McClelland, Maier & Neustadt, L.L.P.

(57) ABSTRACT

The semiconductor device includes a substrate having a conductive layer formed on its surface. The conductive layer has a columnar semiconductor formed thereon. The columnar semiconductor has an insulating layer formed therearound. The insulating layer has an electrode film formed therearound. The electrode film functions as an gate electrode of a transistor. The electrode film includes an laminate of two or more conductive films having different work functions.

11 Claims, 18 Drawing Sheets

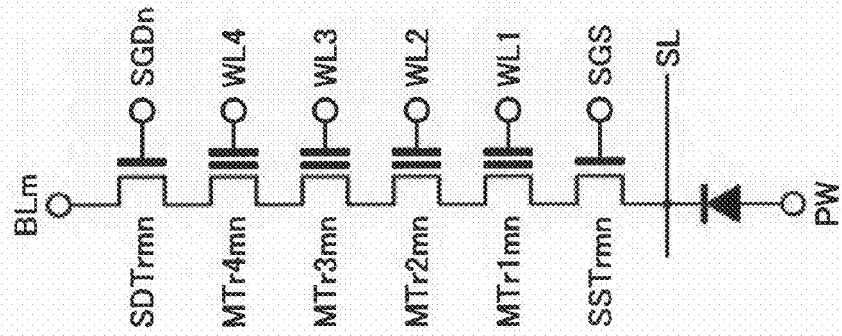
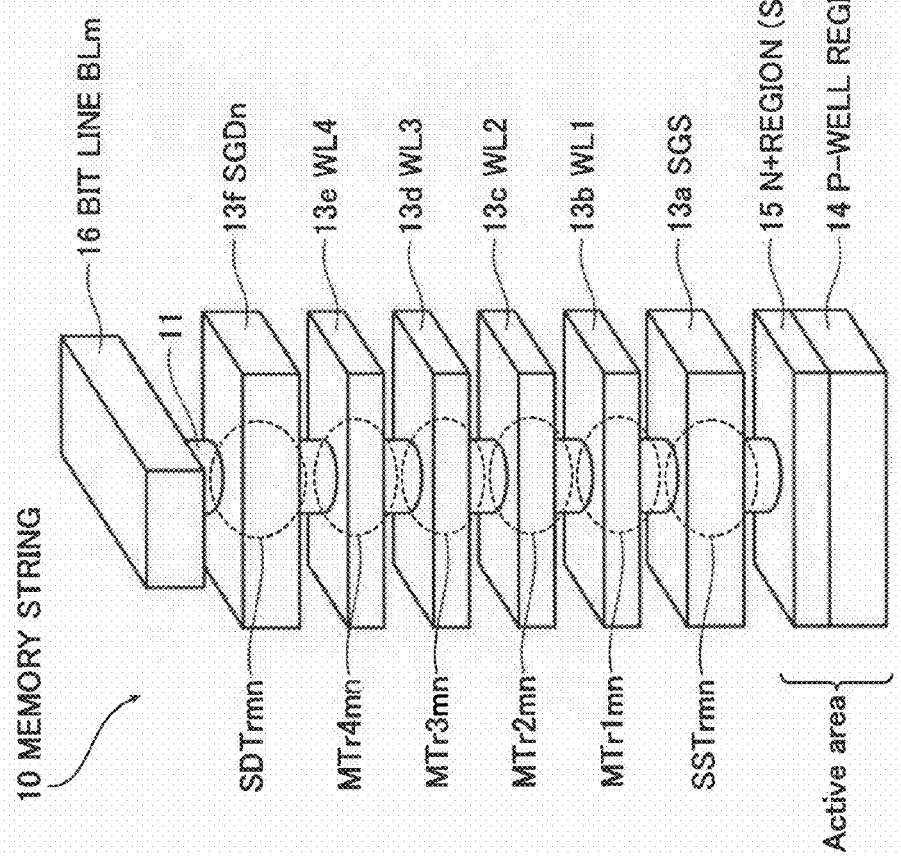

SEMICONDUCTOR MEMORY DEVICE

CROSS REFERENCE TO RELATED APPLICATIONS

This application is based on and claims the benefit of priority from prior Japanese Patent Application No. 2007-006183, filed on Jan. 15, 2007, the entire contents of which are incorporated herein by reference.

BACKGROUND OF THE INVENTION

1. Field of the Invention

The present invention relates to a semiconductor device, and more particularly, to a cylindrical-structure transistor including a channel formed perpendicular to a substrate.

2. Description of the Related Art

Compact and large-capacity non-volatile semiconductor memory devices have been increasingly required. NAND flash memories draw attention to the possibility of higher integration and a larger capacity.

For higher integration and a larger capacity of the NAND flash memories, a smaller design rule is necessary. A smaller design rule requires further microfabrication of wiring patterns or the like. Because further microfabrication of the wiring patterns or the like requires highly advanced manufacturing technologies, it becomes more difficult to reduce the design rule.

For the purpose of more highly integrated memory devices, a large number of semiconductor memory devices have recently been proposed that include three-dimensionally disposed memory cells (see, for example, JP 2003-078044, and Masuoka et al., "Novel Ultrahigh-Density Flash Memory With a Stacked-Surrounding Gate Transistor (S-SGT) Structured Cell," IEEE TRANSACTIONS ON ELECTRON DEVICES, VOL. 50, NO. 4, pp. 945-951, April 2003).

Many of the conventional semiconductor memory devices including three-dimensionally disposed memory cells requires, for each layer of the memory cell portion, a plurality of photo-etching processes (i.e., patterning processes including a lithography process using a photoresist and a fabrication process such as etching). A photo-etching process with a minimum line width of the design rule is referred here to as a "critical photo-etching process." A photo-etching process with a line width larger than the minimum line width of the design rule is referred here to as a "rough photo-etching process." The conventional semiconductor memory device including three-dimensionally disposed memory cells requires three or more critical photo-etching processes for each layer of the memory cell portion. Because many of the conventional semiconductor memory devices simply laminate memory cells, cost increase due to the three-dimensional structure is inevitable.

One of the conventional semiconductor memory devices including three-dimensionally disposed memory cells is a semiconductor memory device that includes a cylindrical-structure transistor (SGT: Surrounding Gate Transistor). See for example, JP 2003-078044.

The cylindrical-structure transistor (SGT) has following advantages. The transistor channel is formed perpendicular to a substrate surface, and so the channel length may be increased without an increase of the chip area. The channel is also generally formed in the film thickness direction that has high process controllability, and so the gate length may be controlled more precisely.

Although the gate length may be controlled more precisely, the profiles of the source/drain diffusion layers tend to be more difficult to be controlled, as compared to the planar transistors.

Proposed processes for forming the source/drain impurity layers include:

(a1): impurity diffusion in the direction normal to the substrate from impurity diffusion regions formed in the silicon substrate surface;

(a2) ion implantation from above the substrate; and (a3) impurity diffusion in the lateral direction from an interlayer dielectric film with impurities previously doped therein.

Since the processes a1 and a3 are easily affected by thermal processing, they have a difficulty in optimizing the gate overlap amount and the LDD structure. In the process a2, the formation of the source/drain impurity regions at deep points on the silicon substrate side should use a high-acceleration ion implantation. It thus tends to take a longer process time to form therein an impurity-diffusion region with a relatively high concentration, resulting in a lower manufacturing throughput.

SUMMARY OF THE INVENTION

A semiconductor device according to an aspect of the present invention includes: a substrate having a conductive layer formed on its surface; a columnar semiconductor formed on the conductive layer; an insulating layer formed around the columnar semiconductor; and an electrode film formed around the insulating layer, the electrode film functioning as a gate electrode of a transistor, the electrode film including an laminate of two or more conductive films having different work functions.

BRIEF DESCRIPTION OF THE DRAWINGS

FIG. 11A is a schematic configuration diagram of a memory string of a non-volatile semiconductor memory device according to the seventh embodiment of the present invention;

FIG. 11B is a schematic configuration diagram of a memory string of a non-volatile semiconductor memory device according to the seventh embodiment of the present invention;

DETAILED DESCRIPTION OF THE EMBODIMENTS

First Embodiment

An embodiment of the present invention will be described below.

Figure 1:
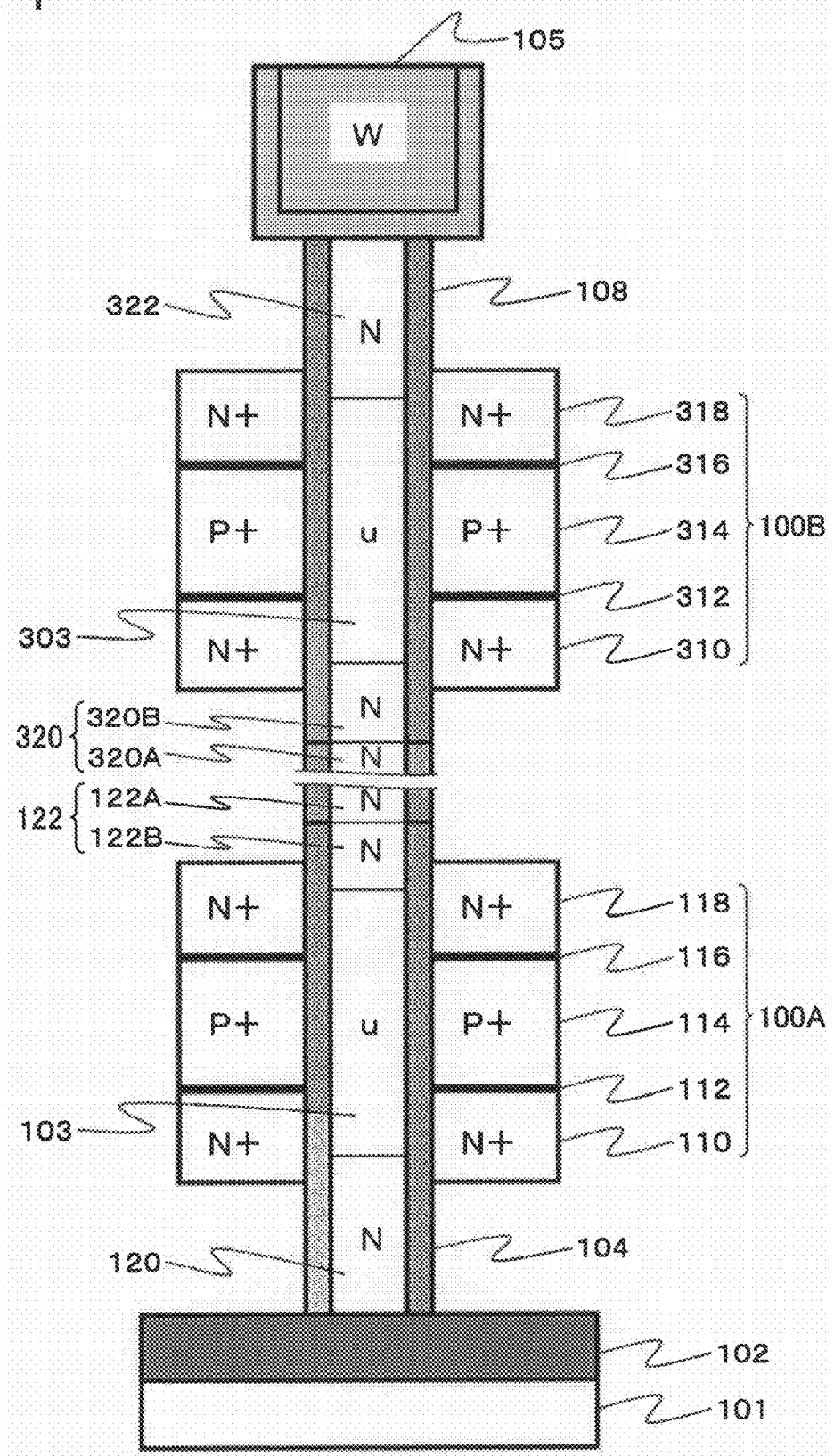
FIG. 1 is a cross sectional view of a transistor according to a first embodiment of the present invention.

FIG. 1 is a structure diagram of a cylindrical-structure transistor as a semiconductor device of this embodiment.

A silicon substrate 101 has a conductive layer such as an n+ type region 102 formed thereon. The n+ type region 102 has a columnar amorphous silicon layer 103 formed thereon. The amorphous silicon layer 103 has a tungsten (W) electrode 105 formed thereon. The amorphous silicon layer 103 has a diameter of about 80 [nm]. Immediately after the amorphous silicon layer 103 is deposited, the layer 103 is an undoped layer with no impurities doped therein. Like the transistor's source/drain formed by thermal diffusion, a certain area of the amorphous silicon layer 103 is implanted with impurity ions such as phosphorous (P) to form an n type layer.

The amorphous silicon layer 103 is surrounded by an insulating layer 104 such as a thermally-oxidized silicon film having a thickness of about 10 [nm]. A gate electrode 100A is formed on the insulating layer 104.

The gate electrode is generally made of only a p+ type semiconductor having impurities such as boron (B) doped therein. The gate overlap amount in the drain/source regions and the concentration gradient in the vicinity of the drain/source regions therefore depend on the solid-state diffusion. Because, however, the solid-state diffusion is not highly controllable, the general gate electrode of a single-layer structure provides a significantly variable gate overlap amount and concentration gradient for each transistor.

In this embodiment, the gate electrode 100A includes a laminate of an n+ type lower-layer electrode layer 110, an interfacial nitride film 112, a p+ type intermediate-layer electrode layer 114, an interfacial nitride film 116, and an n+ type upper-layer electrode layer 118. The lower-layer electrode layer 110 is implanted with a high concentration impurity such as phosphorous (P) and has a film thickness of 100 [nm]. The interfacial nitride film 112 has a thickness of 2 [nm]. The intermediate-layer electrode layer 114 is implanted with a high concentration impurity such as boron (B) and has a film thickness of 200 [nm]. The interfacial nitride film 116 has a thickness of 2 [nm]. The upper-layer electrode layer 118 is implanted with a high concentration impurity such as phosphorous (P) and has a film thickness of 100 [nm].

The amorphous silicon layer 103 receives impurities from the n+ type region 102 by thermal diffusion, thereby forming an n type region 120 (in this embodiment, the n type region 120 has an impurity concentration of $1 \times 10^{17}$ [cm$^{-3}$] on the n+ type region 102 side). The n type region 120 functions as drain/source regions of the transistor. The n type region 120 thus formed has an upper surface reaching above the lower surface of the lower-layer electrode layer 110. In the upper portion of the amorphous silicon layer 103, an n type region 122B is formed by ion implantation in the area the upper-layer electrode layer 118 has its upper surface (i.e., in the area overlapping the upper surface of the gate electrode 100A).

After certain processes, an n type region 122A is formed by thermal diffusion from the n type region 122B. The n type regions 122B and 122A together provide an n type region 122 that functions as drain/source regions of the transistor.

The transistor shown in FIG. 1 then behaves as follows near the threshold voltage in the actual operation. The lower-layer electrode layer 110 has a lower work function than the intermediate-layer electrode layer 114. When, therefore, a channel starts to be formed in the amorphous silicon layer 103 in the vicinity of the intermediate-layer electrode layer 114, electrons are already induced in the amorphous silicon layer 103 in the vicinity of the lower-layer electrode layer 110. When, therefore, the gate electrode 100A is applied with a voltage close to the threshold voltage, the area between the intermediate-layer electrode layer 114 and the lower-layer electrode layer 110 always has a low-concentration carrier-induced layer due to the work function difference, regardless of the degree of the solid-state diffusion. The carrier-induced layer functions as a lightly doped drain (LDD) structure. Because the edge position of the carrier-induced layer depends on the lower-layer electrode layer 110, the variation among devices may be reduced. The same holds true for the area between the upper portion electrode layer 118 and the intermediate-layer electrode layer 114. Specifically, the upper-layer electrode layer 118 has a lower work function than the intermediate-layer electrode layer 114. When, therefore, a channel is formed in the amorphous silicon layer 103 in the vicinity of the intermediate-layer electrode layer 114, electrons are already induced in the amorphous silicon layer 103 in the vicinity of the upper-layer electrode layer 118. When, therefore, the gate electrode 101A is applied with a voltage close to the threshold voltage, the area between the intermediate-layer electrode layer 114 and the upper-layer electrode layer 118 always has a low-concentration carrier-induced layer due to the work function difference, regardless of the degree of the solid-state diffusion. The carrier-induced layer functions as a lightly doped drain (LDD) structure function. The variation among devices may thus be reduced. Thus, the reliability and the yield of the semiconductor memory device may be improved.

Note that in FIG. 1, the area between the tungsten (W) electrode 105 and the transistor includes another transistor of a similar configuration connected in series. Specifically, a gate electrode 100B is formed including a laminate of an n+ type lower-layer electrode layer 310, an interfacial nitride film 312, a p+ type intermediate-layer electrode layer 314, an interfacial nitride film 316, and an n+ type upper-layer electrode layer 318. The lower-layer electrode layer 310 is implanted with a high concentration impurity such as phosphorous (P) and has a film thickness of 100 [nm]. The interfacial nitride film 312 has a thickness of 2 [nm], The intermediate-layer electrode layer 314 is implanted with a high concentration impurity such as boron (B) and has a film thickness of 200 [nm]. The interfacial nitride film 316 has a thickness of 2 [nm]. The upper-layer electrode layer 318 is implanted with a high concentration impurity such as phosphorous (P) and has a film thickness of 100 [nm].

In the upper portion of the amorphous silicon layer 103, an amorphous silicon layer 303 is formed. The amorphous silicon layer 303 and the gate electrode 100B together provide the transistor. In the lower portion of the amorphous silicon layer 303, an n type region 320A is formed by ion implantation. An n type region 320B is formed by thermal diffusion from the n type region 320A. The n type regions 320A and 320B together provide an n type region 320. The N type region 320 functions as drain/source regions of the transistor. The n type region 320B has an upper surface reaching above the lower surface of the lower-layer electrode layer 310.

In the upper portion of the amorphous silicon layer 303, an n type region 322 is formed by ion implantation. The region 322 functions as drain/source regions of the transistor. The n type region 322 has a lower surface reaching below the upper surface of the upper-layer electrode layer 318.

Second Embodiment

Figure 2:
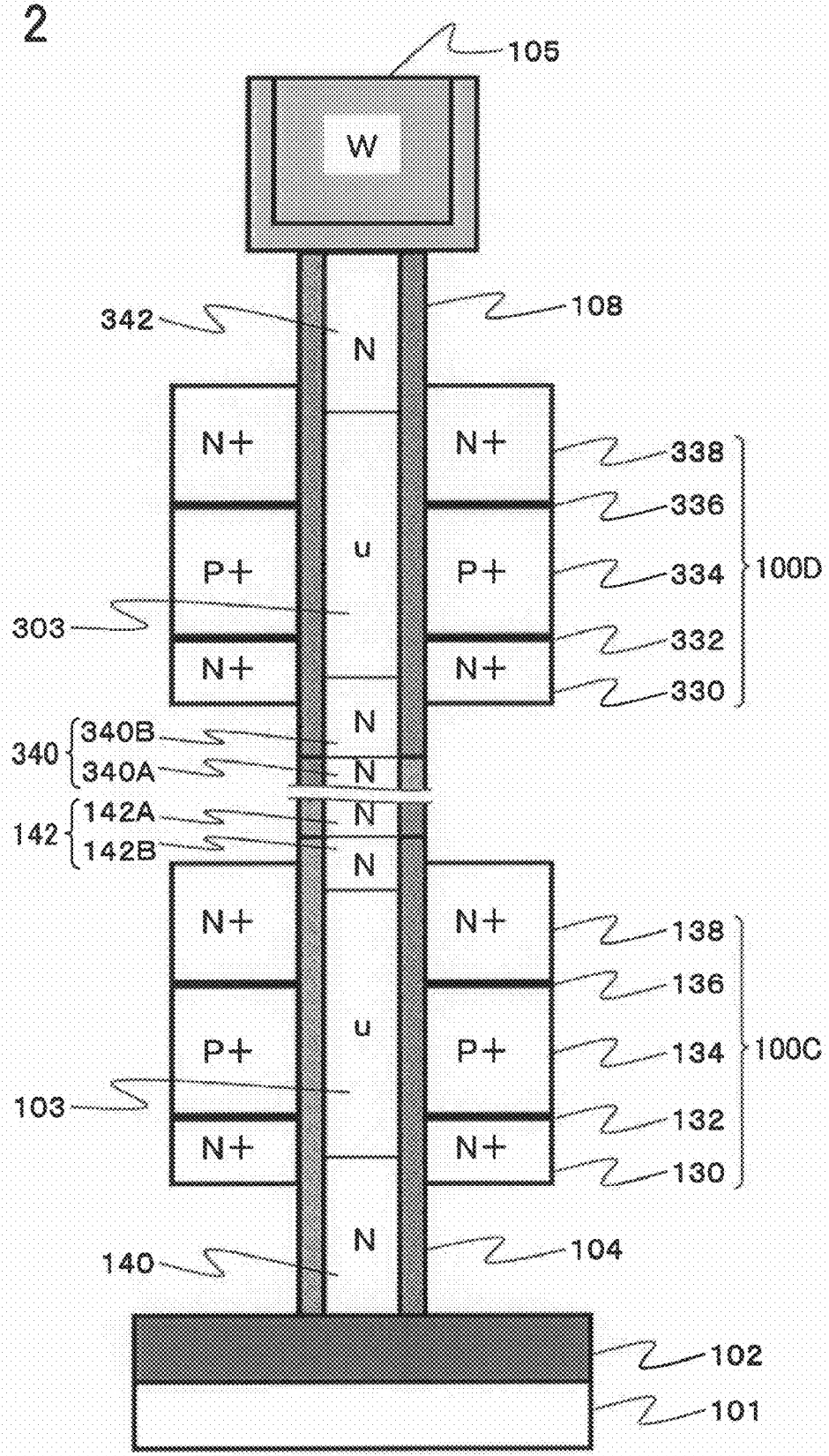
FIG. 2 is a cross sectional view of a transistor according to a second embodiment of the present invention.

With reference to FIG. 2, a second embodiment of the present invention will be described. In FIG. 2, like elements as those in the first embodiment (FIG. 1) are designated with like reference numerals, and their detailed description is omitted below.

Referring to FIG. 2, in this embodiment, a gate electrode 100C is formed including a laminate of an n+ type lower-layer electrode layer 130, an interfacial nitride film 132, a p+ type intermediate-layer electrode layer 134, an interfacial nitride film 136, and an n+ type upper-layer electrode layer 138. The lower-layer electrode layer 130 is implanted with a high concentration impurity such as phosphorous (P) and has a film thickness of 50 [nm]. The interfacial nitride film 132 has a thickness of 2 [nm]. The intermediate-layer electrode layer 134 is implanted with a high concentration impurity such as boron (B) and has a film thickness of 200 [nm]. The interfacial nitride film 136 has a thickness of 2 [nm], The upper-layer electrode layer 138 is implanted with a high concentration impurity such as phosphorous (P) and has a film thickness of 150 [nm].

The amorphous silicon layer 103 receives impurities from the n+ type region 102 by thermal diffusion, thereby forming an n type region 140 (in this embodiment, the n type region 140 has an impurity concentration of $1 \times 10^{17}$ [cm$^{-3}$] on the n+ type region 102 side). The n type region 140 functions as drain/source regions of the transistor. The n type region 140 thus formed has an upper surface reaching above the lower surface of the lower-layer electrode layer 130.

In the upper portion of the amorphous silicon layer 103, an n type region 142B is formed by ion implantation in the area where the upper-layer electrode layer 138 has its upper surface via the insulating layer 104.

After certain processes, an n type region 142A is formed by thermal diffusion from the n type region 142B. The n type regions 142A and 142B together provide an n type region 142 that functions as drain/source regions of the transistor.

The n type region 140 formed in the lower portion of the amorphous silicon layer 103 is formed by thermal diffusion from the n+ type region 102. The n type region 142 formed in the upper portion of the amorphous silicon layer 103 is formed by thermal diffusion from the high-concentration n type layer 142B that is formed by ion implantation. In this case, the n type region 142 formed by thermal diffusion from the n type layer formed by ion implantation tends to change in impurity profile more slowly than the n type region 140. In order to absorb this difference, the upper-layer electrode layer 138 is formed thicker than the lower-layer electrode layer 130.

In FIG. 2, the area between the tungsten (W) electrode 105 and the transistor includes another transistor of a similar configuration connected in series. Specifically, a gate electrode 100D is formed including a laminate of an n+ type lower-layer electrode layer 330, an interfacial nitride film 332, a p+ type intermediate-layer electrode layer 334, an interfacial nitride film 336, and an n+ type upper-layer electrode layer 338. The lower-layer electrode layer 330 is implanted with a high concentration impurity such as phosphorous (P) and has a film thickness of 50 [nm]. The interfacial nitride film 332 has a thickness of 2 [nm]. The intermediate-layer electrode layer 334 is implanted with a high concentration impurity such as boron (B) and has a film thickness of 200 [nm]. The interfacial nitride film 336 has a thickness of 2 [nm]. The upper-layer electrode layer 338 is implanted with a high concentration impurity such as phosphorous (P) and has a film thickness of 150 [nm].

The lower portion of the amorphous silicon layer 303 receives impurities by thermal diffusion from the n type region 340A that has already been formed by ion implantation, thereby forming an n type region 340B. The n type regions 340A and 340B together provide an n type region 340 that functions as drain/source regions of the transistor.

The n type region 340B is formed reaching above the lower surface of the lower-layer electrode layer 330. In the upper portion of the amorphous silicon layer 303, an n type region 342 is formed by ion implantation. The region 342 functions as drain/source regions of the transistor. The n type region 342 has an lower surface reaching below the upper surface of the upper-layer electrode layer 338.

Third Embodiment

Figure 3:
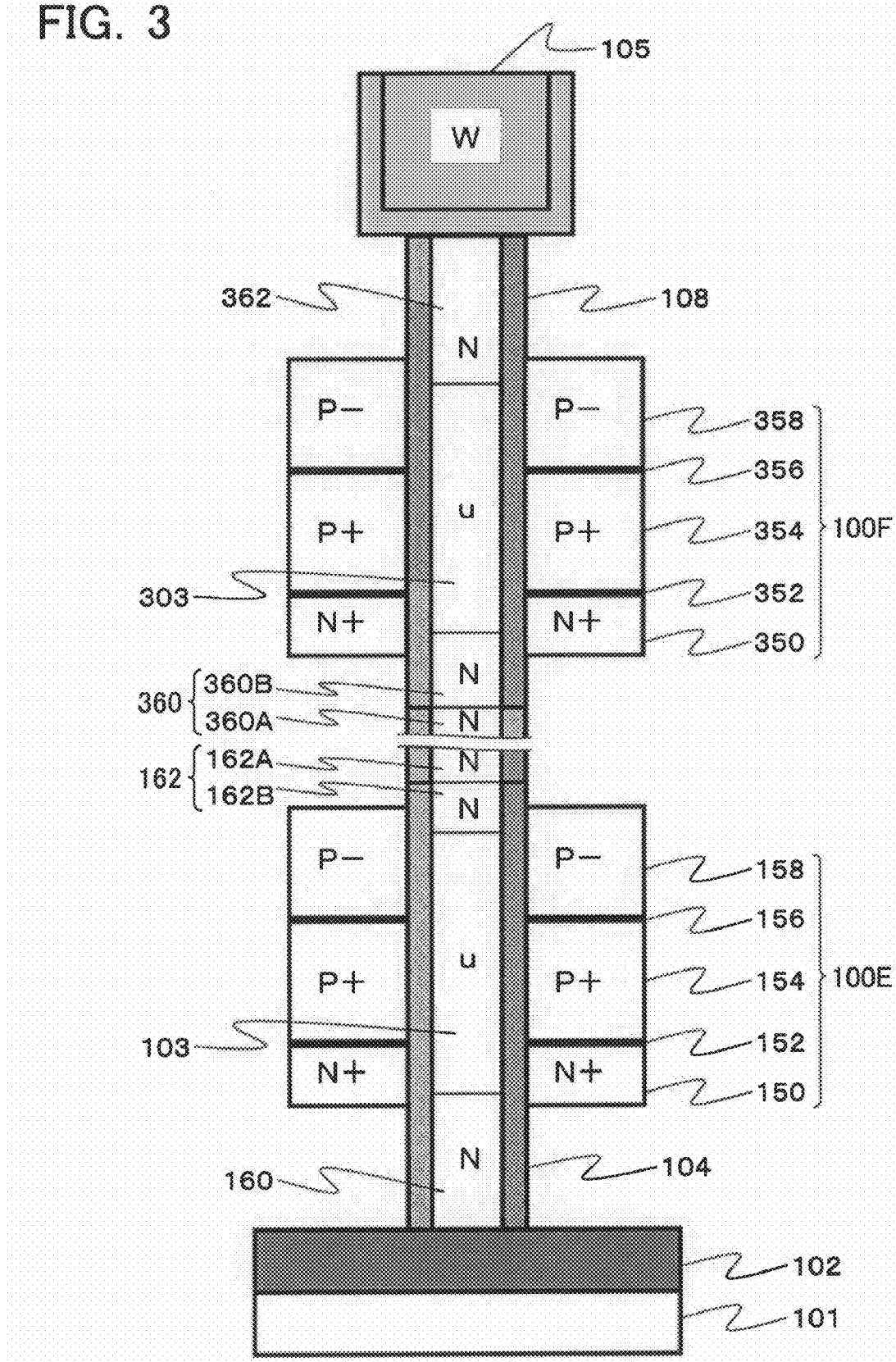
FIG. 3 is a cross sectional view of a transistor according to a third embodiment of the present invention.

With reference to FIG. 3, a third embodiment of the present invention will be described. In FIG. 3, like elements as those in the first embodiment (FIG. 1) are designated with like reference numerals, and their detailed description is omitted below.

Referring to FIG. 3, in this embodiment, a gate electrode 100E is formed including a laminate of an n+ type lower-layer electrode layer 150, an interfacial nitride film 152, a p+ type intermediate-layer electrode layer 154, an interfacial nitride film 156, and a p− type upper-layer electrode layer 158. The lower-layer electrode layer 150 is implanted with a high concentration impurity such as phosphorous (P) and has a film thickness of 50 [nm]. The interfacial nitride film 152 has a thickness of 2 [nm]. The intermediate-layer electrode layer 154 is implanted with a high concentration impurity such as boron (B) and has a film thickness of 200 [nm]. The interfacial nitride film 156 has a thickness of 2 [nm]. The upper-layer electrode layer 158 is implanted with a low concentration impurity such as boron (B) and has a film thickness of 150 [nm].

The amorphous silicon layer 103 receives impurities from the n+ type region 102 by thermal diffusion, thereby forming an n type region 160 (in this embodiment, the n type region 160 has an impurity concentration of $1 \times 10^{17}$ [cm$^{-3}$] on the n+ on the n+ type region 102 side). The n type region 160 functions as drain/source regions of the transistor. The n type region 160 thus formed has an upper surface reaching above the lower surface of the lower-layer electrode layer 150. In the upper portion of the amorphous silicon layer 103, an n type region 162B is formed, by ion implantation, in the area where the upper-layer electrode layer 158 is formed. After certain processes, an n type region 162A is formed by thermal diffusion from the n type region 162B. The n type regions 162A and 162B together provide an n type region 162. The n type region 162B thus formed has a lower surface reaching below the upper surface of the upper-layer electrode layer 158.

In this embodiment, the p– type upper-layer electrode layer 158 of low concentration is formed. When the gate electrode 100E is applied with a voltage equal to or lower than a threshold voltage to turn off the transistor, the p– type upper-layer electrode layer 158 of low concentration is depleted at a portion facing the amorphous silicon layer 103. This prevents a high electric field from being applied between the gate and drain. Specifically, when the transistor is turned off, the transistor has an offset structure in which the effective gate edge is apart from the drain. The drain-edge electric field may thus be reduced. This may suppress a large leak-current flow caused by carriers injected from the drain edge into the channel portion that turn on a parasitic bipolar transistor. The lower electric field at the drain-edge portion may reduce the leak current, thereby improving the cut-off characteristics.

Note that in FIG. 3, the area between the tungsten (W) electrode 105 and the transistor includes another transistor of a similar configuration connected in series. Specifically, a gate electrode 100F is formed including a laminate of an n+ type lower-layer electrode layer 350, an interfacial nitride film 352, a p+ type intermediate-layer electrode layer 354, an interfacial nitride film 356, and a p– type upper-layer electrode layer 358.

The lower-layer electrode layer 350 is implanted with a high concentration impurity such as phosphorous (P) and has a film thickness of 50 [nm]. The interfacial nitride film 352 has a thickness of 2 [nm]. The intermediate-layer electrode layer 354 is implanted with a high concentration impurity such as boron (B) and has a film thickness of 200 [nm]. The interfacial nitride film 356 has a thickness of 2 [nm]. The upper-layer electrode layer 358 is implanted with a low concentration impurity such as boron (B) and has a film thickness of 150 [nm].

The lower portion of the amorphous silicon layer 303 receives impurities by thermal diffusion from the n type region 360A that has already been formed by ion implantation, thereby forming an n type region 360B. The n type regions 360A and 360B together provide an n type region 360 that functions as source/drain regions of a transistor. The n type region 360B has an upper surface reaching above the lower surface of the lower-layer electrode layer 350.

In the upper portion of the amorphous silicon layer 303, an n type region 362 is formed by ion implantation. The region 362 functions as drain/source regions of the transistor. The n type region 362 has a lower surface reaching below the lower surface of the upper-layer electrode layer 358.

Fourth Embodiment

Figure 4:
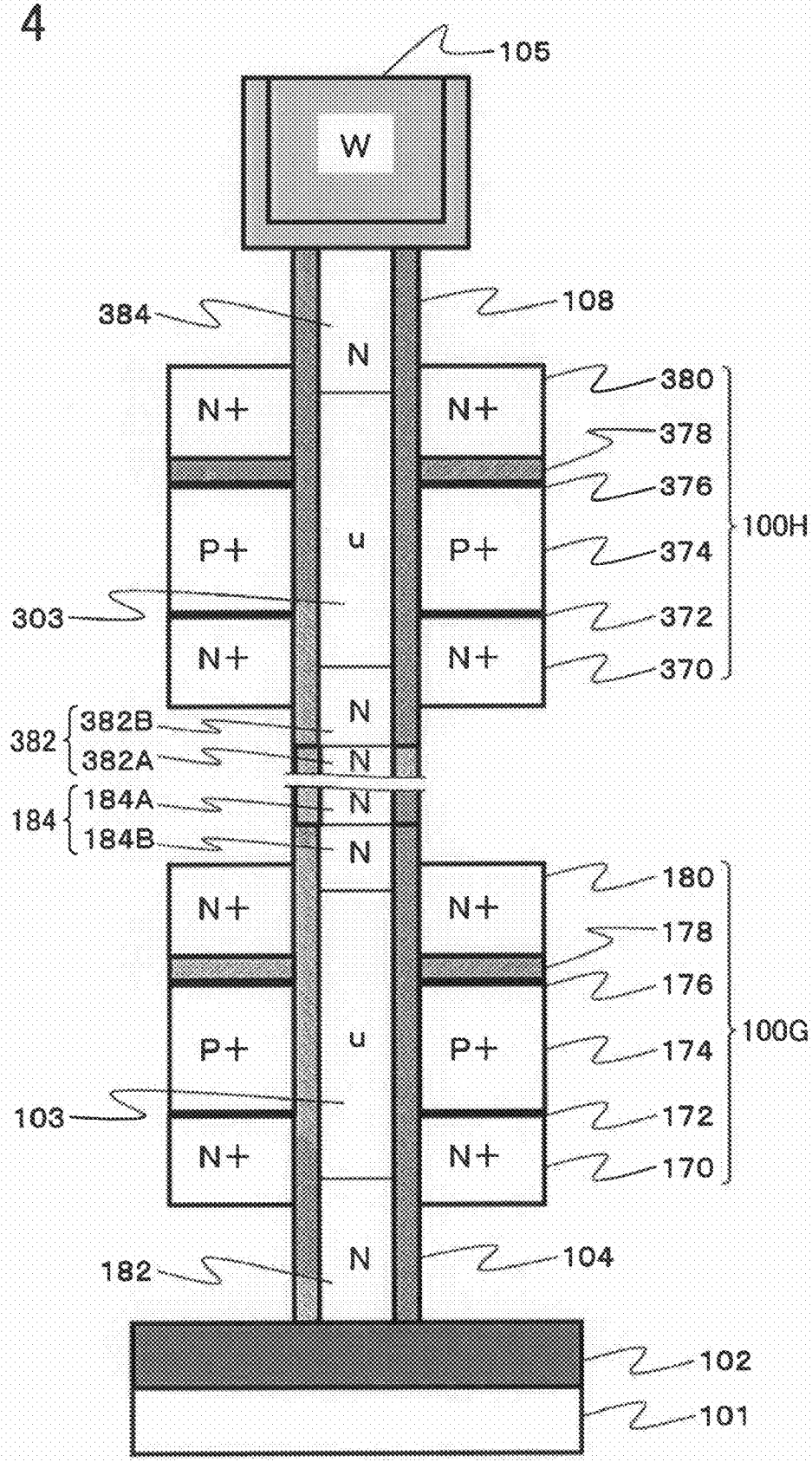
FIG. 4 is a cross sectional view of a transistor according to a fourth embodiment of the present invention.

With reference to FIG. 4, a fourth embodiment of the present invention will be described. In FIG. 4, like elements as those in the first embodiment (FIG. 1) are designated with like reference numerals, and their detailed description is omitted below.

Referring to FIG. 4, in this embodiment, a gate electrode 100G is formed including a laminate of an n+ type lower-layer electrode layer 170, an interfacial nitride film 172, a p+ type intermediate-layer electrode layer 174, an interfacial nitride film 176, a silicon oxide film 178, and an n+ type upper-layer electrode layer 180.

The lower-layer electrode layer 170 is implanted with a high concentration impurity such as phosphorous (P) and has a film thickness of 100 [nm]. The interfacial nitride film 172 has a thickness of 2 [nm]. The intermediate-layer electrode layer 174 is implanted with a high concentration impurity such as boron (B) and has a film thickness of 200 [nm]. The interfacial nitride film 176 has a thickness of 2 [nm]. The silicon oxide film 178 has a thickness of 30 [nm]. The upper-layer electrode film 180 is implanted with a high concentration impurity such as phosphorous (P) and has a film thickness of 100 [nm].

The amorphous silicon layer 103 receives impurities from the n+ type region 102 by thermal diffusion, thereby forming an n type region 182 (in this embodiment, the n type region 182 has an impurity concentration of $1 \times 10^{17}$ $[cm^{-3}]$ on the n+ on the n+ type region 102 side). The n type region 182 functions as drain/source regions of the transistor. The n type region 182 thus formed has an upper surface reaching above the lower surface of the lower-layer electrode layer 170. In the upper portion of the amorphous silicon layer 103, an n type region 184B is formed in the area where the upper-layer electrode layer 180 is formed, by ion implantation. After certain processes, an n type region 184A is formed by thermal diffusion from the n type region 184B. The n type regions 184A and 184B together provide an n type region 184 that functions as drain/source regions of the transistor.

The n type region 184B thus formed has a lower surface reaching below the upper surface of the upper-layer electrode layer 180.

In this embodiment, the area between the intermediate-layer electrode layer 174 and the upper-layer electrode layer 180 includes the interfacial nitride film 176 and additionally the silicon oxide layer 178. A transistor including the gate electrode 100G thus has a so-called drain-offset structure. This structure may avoid the electric field concentration at the drain-edge portion. The offset amount does not depend on the alignment accuracy in lithography or the like, but on the insulating layers (the interfacial nitride film 176 and the silicon oxide layer 178), which may be formed with high process controllability. The device-to-device variation may thus be minimized. This may provide a transistor controllable to have a less leak current and a less parasitic resistance effect against an ON current. This may provide a transistor having a high switching characteristic along with an excellent ON/OFF ratio.

Note that in FIG. 4, the area between the tungsten (W) electrode 105 and the transistor includes another transistor of a similar configuration connected in series. Specifically, a gate electrode 100H is formed including a laminate of an n+ type lower-layer electrode layer 370, an interfacial nitride film 372, a p+ type intermediate-layer electrode layer 374, an interfacial nitride film 376, a silicon oxide layer 378, and an n+ type upper-layer electrode layer r 380. The lower-layer electrode layer 370 is implanted with a high concentration impurity such as phosphorous (P) and has a film thickness of 100 [nm]. The interfacial nitride film 372 has a thickness of 2 [nm]. The intermediate-layer electrode layer 374 is implanted with a high concentration impurity such as boron (B) and has a film thickness of 200 [nm]. The interfacial nitride film 376 has a thickness of 2 [nm]. The silicon oxide film 378 has a thickness of 30 [nm]. The upper-layer electrode layer 380 is implanted with a high concentration impurity such as phosphorous (P) and has a film thickness of 100 [nm].

The lower portion of the amorphous silicon layer 303 receives impurities by thermal diffusion from the n type region 382A that has already been formed by ion implantation, thereby forming an n type region 382B. The n type regions 382A and 382B together provide an n type region 382 that functions as drain/source regions of the transistor. The n type region 382B has an upper surface reaching above the lower surface of the lower-layer electrode layer 370. In the upper portion of the amorphous silicon layer 303, an n type region 384 is formed by ion implantation. The region 384 functions as drain/source regions of the transistor. The n type region 384 has a lower surface reaching below the upper surface of the upper-layer electrode layer 380.

Figure 5:
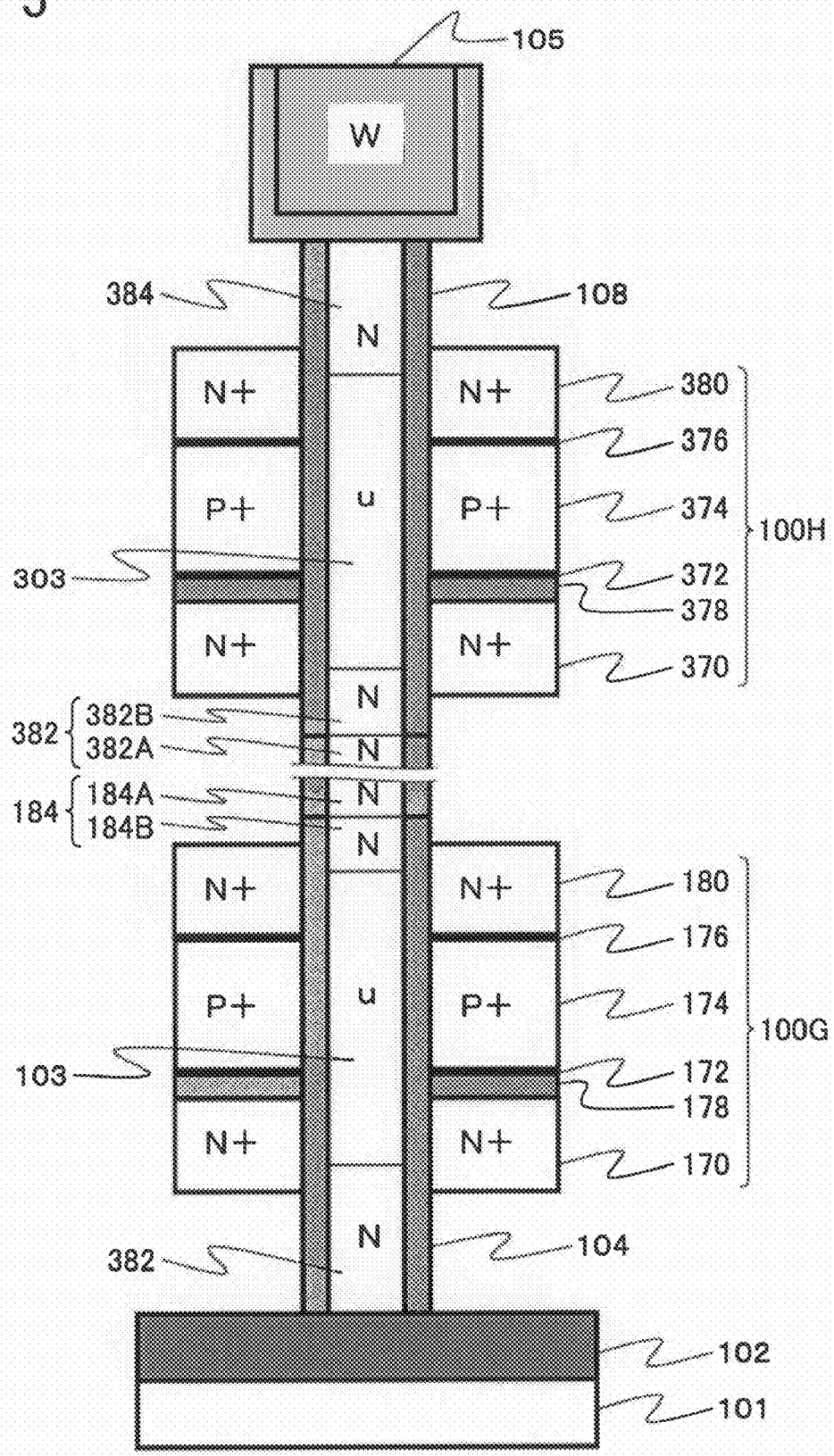
FIG. 5 is a cross sectional view of another transistor according to the fourth embodiment of the present invention.

Note that as shown in FIG. 5, the silicon oxide layers 178 and 378 may be formed adjacent to the interfacial nitride films 172 and 372, respectively.

Figure 6:
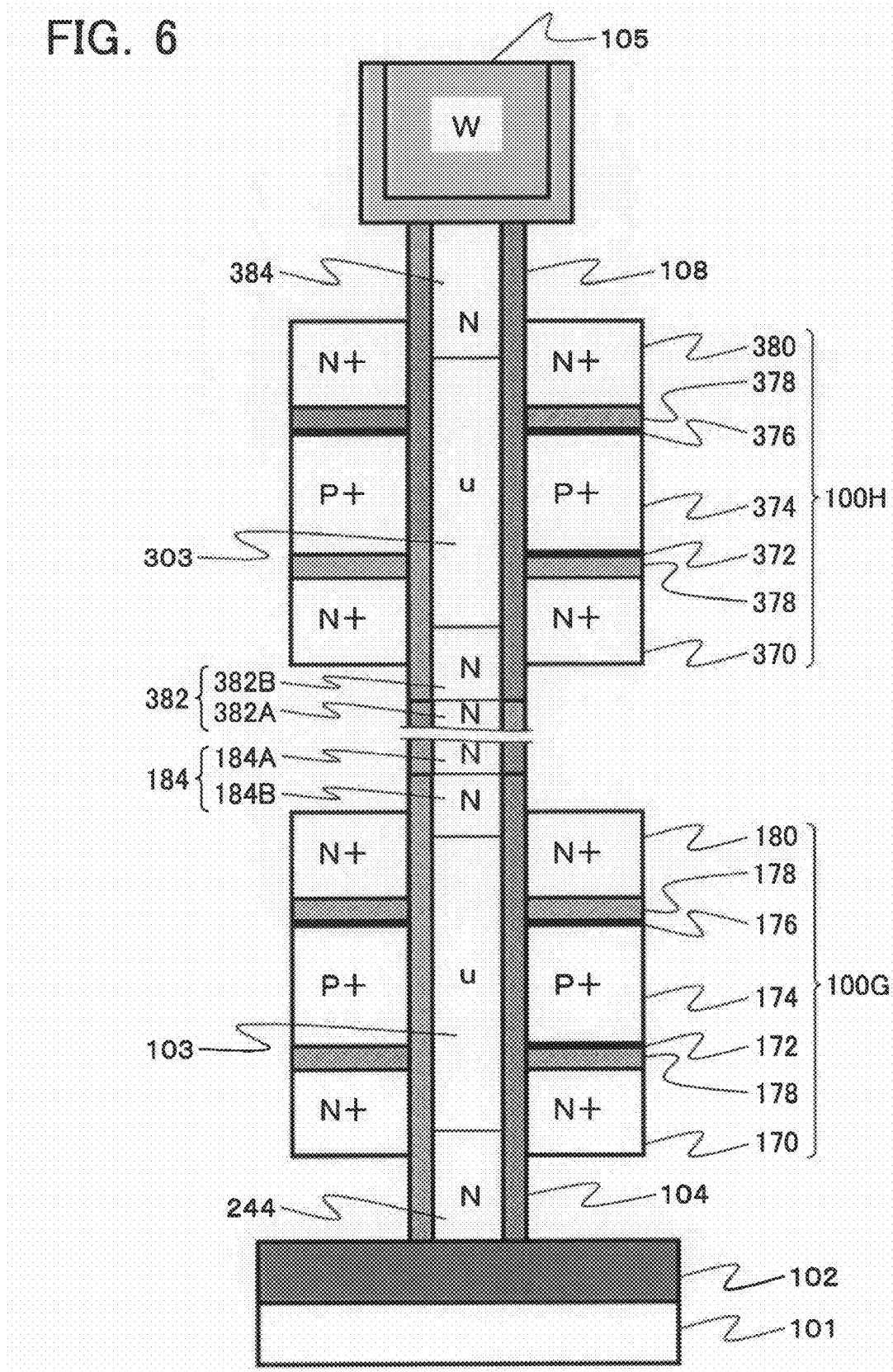
FIG. 6 is a cross sectional view of another transistor according to the fourth embodiment of the present invention.

In reference to FIG. 6, the silicon oxide layer 178 may be formed adjacent to the interfacial nitride films 172 and 176, and the silicon oxide layer 378 may be formed adjacent to the interfacial nitride films 372 and 376.

Fifth Embodiment

Figure 7:
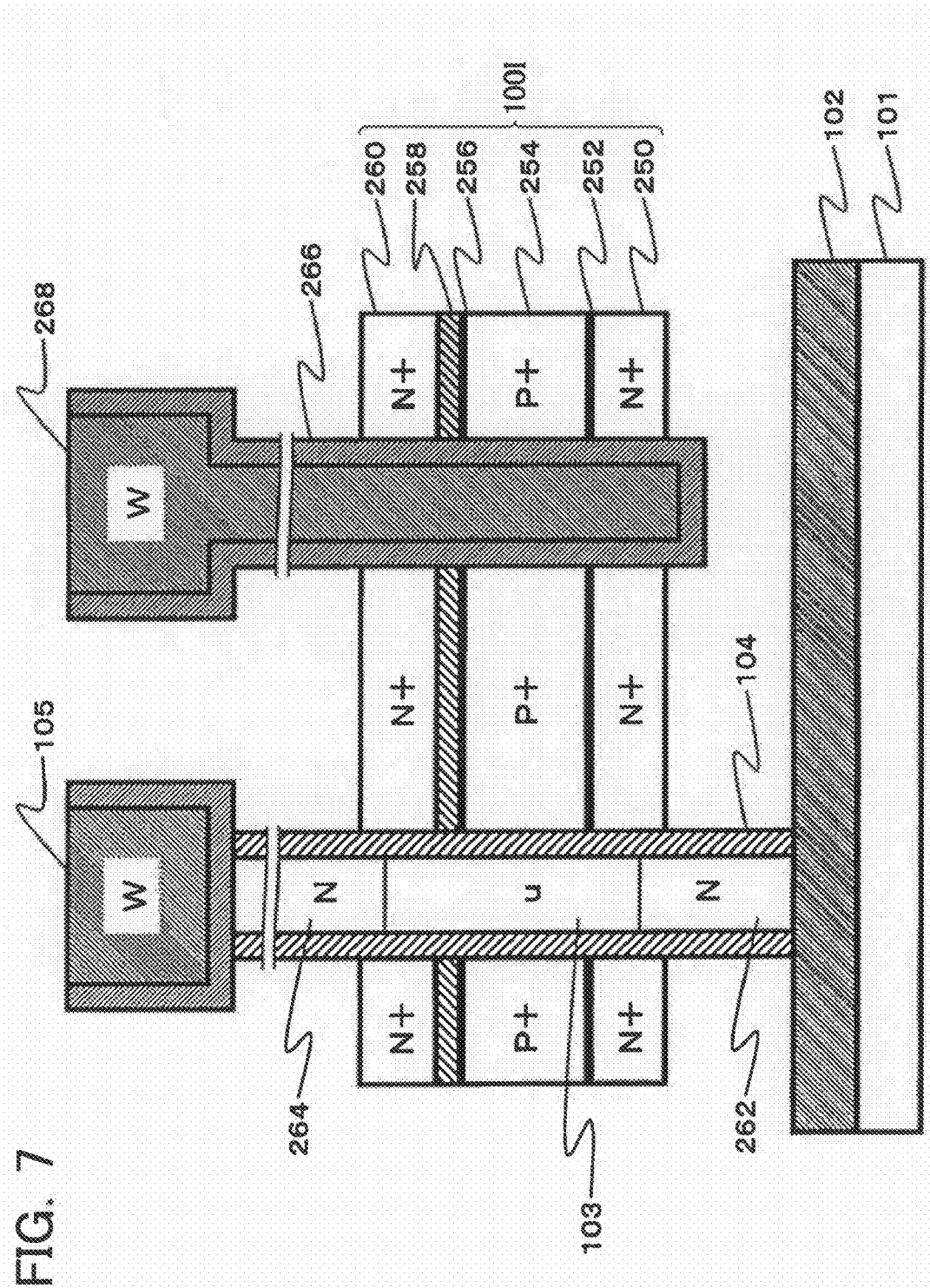
FIG. 7 is a cross sectional view of a transistor according to a fifth embodiment of the present invention.

With reference to FIG. 7, a fifth embodiment of the present invention will be described. In FIG. 7, like elements as those in the first embodiment (FIG. 1) are designated with like reference numerals, and their detailed description is omitted below.

The fifth embodiment provides a contact structure to ensure uniform potential on the upper-layer electrode layer, the intermediate-layer electrode layer, and the lower-layer electrode layer as shown in the first to fourth embodiments.

The conventional single-layer gate electrode generally has a contact structure with its top surface in contact with a contact plug bottom. In the laminated gate-electrode structure of this embodiment, the electrode layers form a PN junction therebetween and have an insulating layer therebetween to provide the offset structure. It is thus difficult to apply a uniform potential on all electrode layers. In view thereof, this embodiment provides an improvement.

In reference to FIG. 7, a gate electrode 100I is formed, as in the fourth embodiment, including a laminate of an n+ type lower-layer electrode layer 250, an interfacial nitride film 252, a p+ type intermediate-layer electrode layer 254, an interfacial nitride film 256, a silicon oxide layer 258, and an n+ type upper-layer electrode layer 260. Although not shown, a similar gate electrode is formed over the gate electrode 100I as in the above embodiments. As in the third embodiment, the upper-layer electrode layer 260 may be a p− type semiconductor layer. The silicon oxide layer may be positioned adjacent to the interfacial nitride film 252.

The lower-layer electrode layer 250 is implanted with a high concentration impurity such as phosphorous (P) and has a film thickness of 100 [nm]. The interfacial nitride film 252 has a thickness of 2 [nm]. The intermediate-layer electrode layer 254 is implanted with a high concentration impurity such as boron (B) and has a film thickness of 200 [nm]. The interfacial nitride film 256 has a thickness of 2 [nm], The silicon oxide film 258 has a thickness of 30 [nm]. The upper-layer electrode layer 260 is implanted with a high concentration impurity such as phosphorous (P) and has a film thickness of 100 [nm]. A through-hole is formed by etching such as RIE. The through-hole penetrates all of the lower-layer electrode layer 250, the interfacial nitride film 252, the intermediate-layer electrode layer 254, the interfacial nitride film 256, the silicon oxide layers 258, and the upper-layer electrode layer 260. Metal organic chemical vapor deposition (MOCVD) is then used to form a titanium film 266 having a thickness of about 20 [nm]. The titanium film 266 is then annealed in a hydrogen/nitrogen mixture gas at 550 [° C.]. Silicide is thus formed between the titanium film 266 and each of the polysilicon lower-layer electrode layer 250, intermediate-layer electrode layer 254, and upper-layer electrode layer 260. In addition, the surface of the titanium film 266 is also nitrided, forming a titanium nitride film. A tungsten (W) film 268 is then laminated inside the titanium nitride film 266 by MOCVD. An electrode for the contact plug is thus formed. This may thus form a transistor having an improved operation stability and operation speed.

Sixth Embodiment

Figure 8:
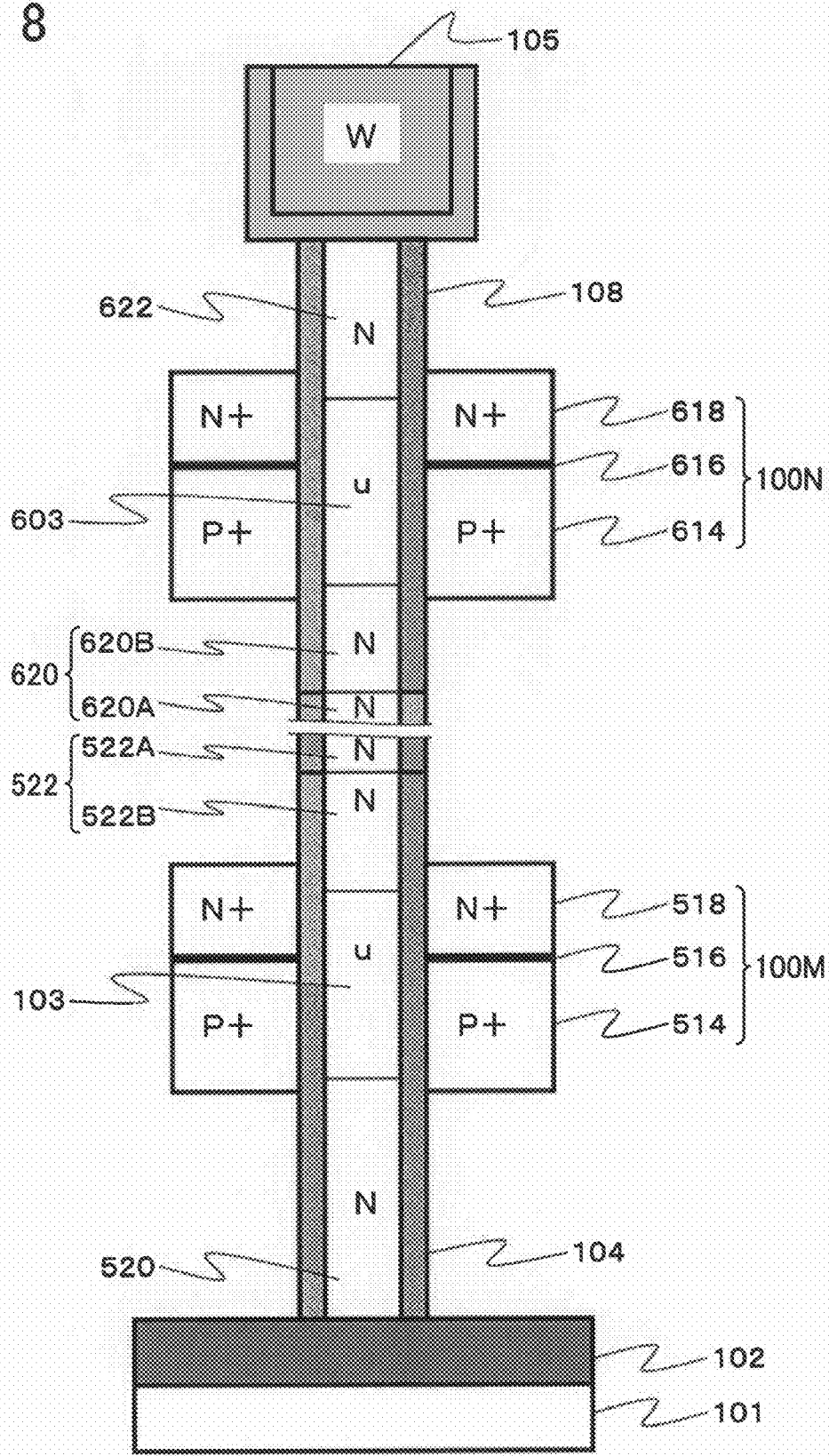
FIG. 8 is a cross sectional view of a transistor according to a sixth embodiment of the present invention.

With reference to FIG. 8, a sixth embodiment of the present invention will be described. In FIG. 8, like elements as those in the first embodiment (FIG. 1) are designated with like reference numerals, and their detailed description is omitted below.

Referring to FIG. 8, in this embodiment, a gate electrode 100M is formed including a laminate of a p+ type lower-layer electrode layer 514, an interfacial nitride film 516, and an n+ type upper-layer electrode layer 518. The p+ type lower-layer electrode layer 514 is implanted with a high concentration impurity such as boron (B) and has a film thickness of 200 [nm]. The interfacial nitride film 516 has a thickness of 2 [nm]. The n+ type upper-layer electrode layer 518 is implanted with a high concentration impurity such as phosphorous (P) and has a film thickness of 150 [nm].

The amorphous silicon layer 103 receives impurities from the n+ type region 102 by thermal diffusion, thereby forming an n type region 520 as transistor drain/source regions (in this embodiment, the n type region 520 has an impurity concentration of $1 \times 10^{17}$ [cm$^{-3}$] on the n+ type region 102 side). The n type region 520 thus formed has an upper surface reaching above the lower surface of the lower-layer electrode layer 514. In the upper portion of the amorphous silicon layer 103, an n type region 522B is formed, by ion implantation, in the area where the upper-layer electrode layer 518 is formed. After certain processes, an n type region 522A is formed by thermal diffusion from the n type region 522B. The n type regions 522A and 522B together provide an n type region 522 as drain/source regions of the transistor. The n type region 522B thus formed has a lower surface reaching below the upper surface of the upper-layer electrode layer 518.

The n type region 520 in the lower portion is formed by thermal diffusion from the n+ type region 102. Then type region 522 in the upper portion is formed by thermal diffusion from the high-concentration n type layer 522B that is formed by ion implantation. This embodiment has advantages including the stable solid-state diffusion process, the accurate source-edge position, and the stable transistor characteristics.

Note that in FIG. 8, the area between the tungsten (W) electrode 105 and the transistor includes another transistor of a similar configuration connected in series. Specifically, a gate electrode 100N is formed including a laminate of a p+ type lower-layer electrode layer 614, an interfacial nitride film 616, and an n+ type upper-layer electrode layer 618. The p+ type lower-layer electrode layer 614 is implanted with a high concentration impurity such as boron (B) and has a film thickness of 200 [nm]. The interfacial nitride film 616 has a film thickness of 2 [nm]. The n+ type upper-layer electrode layer 618 is implanted with a high concentration impurity such as phosphorous (P) and has a film thickness of 150 [nm].

The lower portion of the amorphous silicon layer 603 receives impurities by thermal diffusion from the n type region 620A that has already been formed by ion implantation, thereby forming an n type region 620B. The n type regions 620A and 620B together provide an n type region 620 as drain/source regions of the transistor. The n type region 620B has an upper surface reaching above the lower surface of the lower-layer electrode layer 614. In the upper portion of the amorphous silicon layer 603, an n type region 622 is formed by ion implantation. The region 622 functions as drain/source regions of the transistor. The n type region 622 has an lower surface reaching below the upper surface of the upper-layer electrode layer 618.

Seventh Embodiment

A semiconductor memory device according to a seventh embodiment of the present invention includes, as a selection transistor, any of the transistors formed in the first to sixth embodiments.

Figure 9:
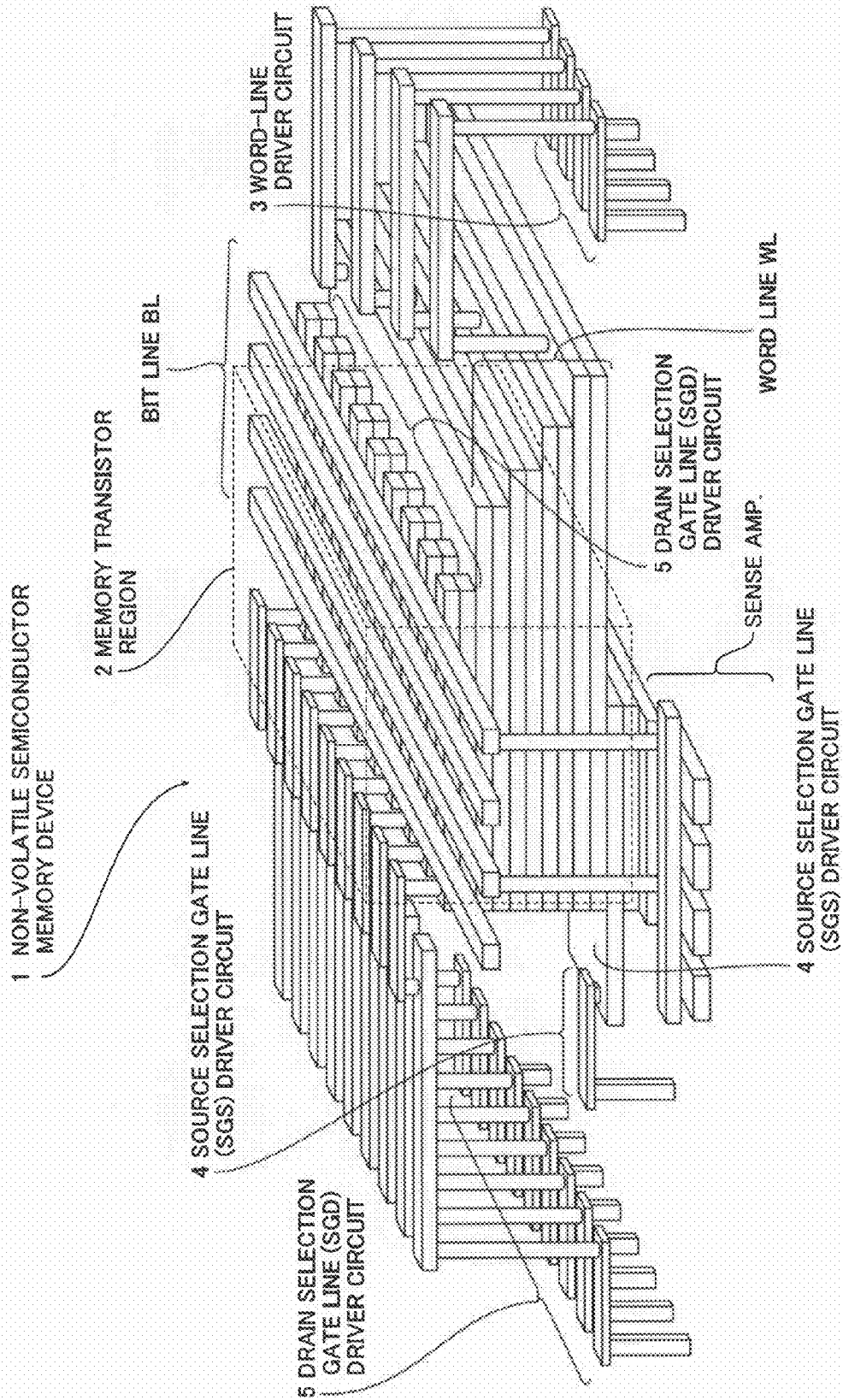
FIG. 9 is a schematic configuration diagram of a non-volatile semiconductor memory device according to a seventh embodiment of the present invention.

FIG. 9 is a schematic configuration diagram of a non-volatile semiconductor memory device according to this embodiment. The non-volatile semiconductor memory device according to this embodiment includes a memory transistor region 2, a word-line driver circuit 3, a source selection gate line (SGS) driver circuit 4, a drain selection gate line (SGD) driver circuit 5, and a sense amplifier 6. In reference to FIG. 9, in the non-volatile semiconductor memory device according to this embodiment, the memory transistor region 2 includes a memory transistor, and the memory transistor includes a laminate of a plurality of semiconductor layers. Also, in reference to FIG. 9, each layer has a word-line WL that extends two-dimensionally in parallel with a surface of the semiconductor substrate (not-shown in FIG. 9). Each word-line WL in each layer has a plane structure, i.e., a plate-like plane structure.

In the non-volatile semiconductor memory device according to this embodiment shown in FIG. 9, each source selection gate line (SGS) has a plate-like planar wiring structure, and each drain selection gate line (SGD) has an insulation-isolated wiring structure.

Figure 10:
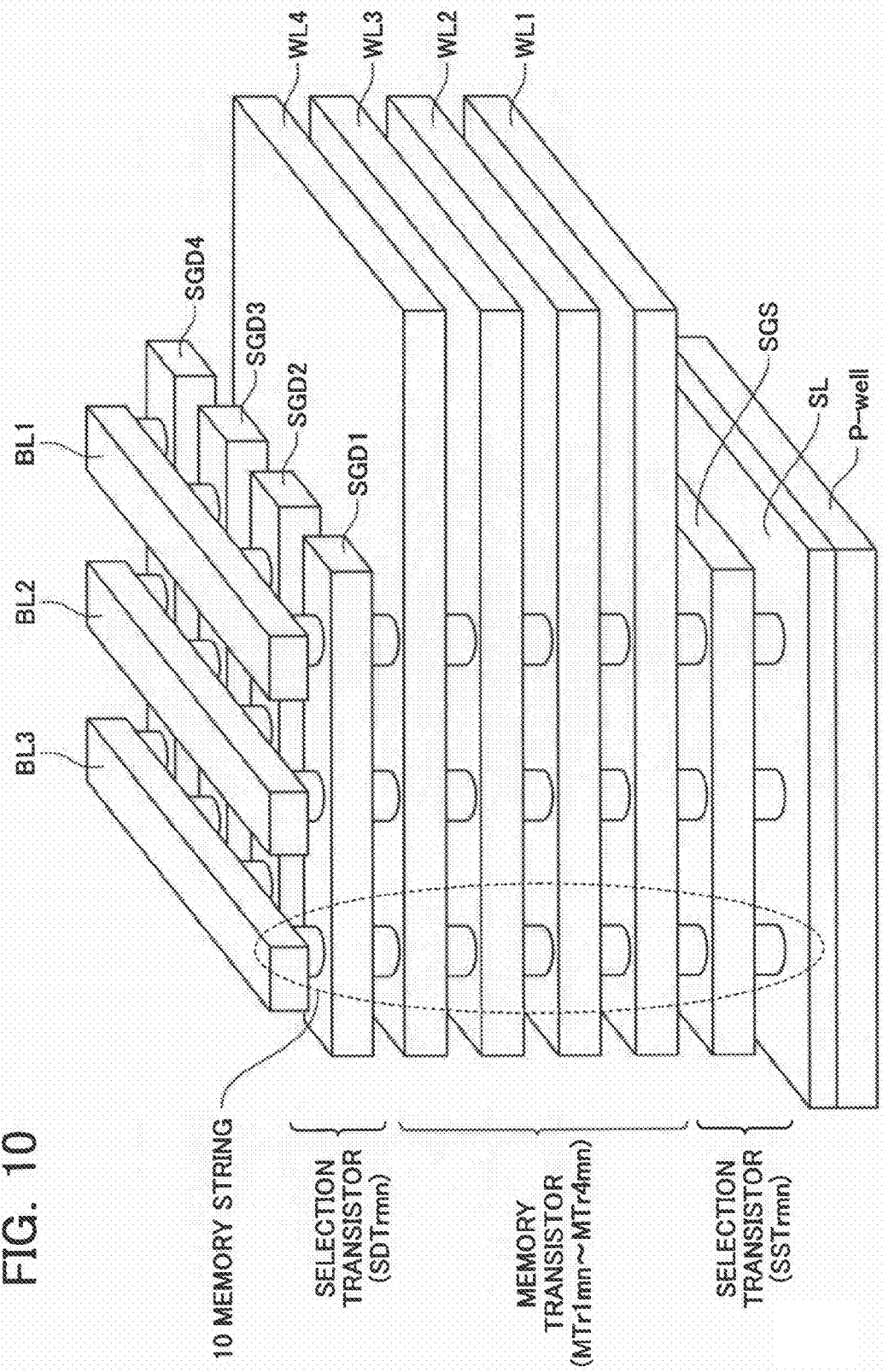
FIG. 10 is a schematic configuration diagram of a memory transistor region of a non-volatile semiconductor memory device according to the seventh embodiment of the present invention.

FIG. 10 is a partial schematic configuration diagram of the memory transistor region 2 of the non-volatile semiconductor memory device according to this embodiment. In this embodiment, the memory transistor region 2 includes m×n memory strings 10 (m and n are natural numbers). Each memory string 10 includes memory transistors (MTr1*mn* to MTr4*nm*) and selection transistors SSTrmn and SDTrmn. FIG. 10 shows an example where m=3 and n=4.

The memory transistors (MTr1*mn* to MTr4*nm*) of each memory string 10 have gates, to which word-lines (WL1 to WL4) are connected, respectively. Each word-line is made of the same conductive layer and is common for each layer. Specifically, the gates of the memory transistor MTr1*mn* of each memory string 10 are all connected to the word-line WL1. The gates of the memory transistor MTr2*nm* of each memory string 10 are all connected to the word-line WL2. The gates of the memory transistor MTr3*nm* of each memory string 10 are all connected to the word-line WL3. The gates of the memory transistor MTr4*nm* of each memory string 10 are all connected to the word-line WL4. In reference to FIGS. 9 and 10, in the non-volatile semiconductor memory device according to this embodiment, each of the word-lines (WL1 to WL4) extends two-dimensionally and has a plate-like plane structure. Each of the word-lines (WL1 to WL4) also has a plane structure generally perpendicular to the memory string 10. The source selection transistor SSTrmn is driven by the source selection gate line SGS. In operation, the gate line SGS may always be at a common potential for each memory string. In this embodiment, therefore, the source selection gate line SGS has a plate-like structure.

Each memory string 10 includes a columnar semiconductor on an n+ region formed on a p-well region of the semiconductor substrate. The memory strings 10 are arranged in a matrix in a plane perpendicular to the columnar semiconductor. Note that the columnar semiconductor may be a cylinder or a prism. The columnar semiconductor includes a columnar semiconductor having a stepped shape.

Each word-line WL may have a width equal to or more than twice the distance equal to the interval between adjacent columnar semiconductors plus the columnar semiconductor's diameter. In other words, each word-line WL preferably has a width equal to or more than twice the distance between the centers of the adjacent columnar semiconductors.

FIG. 11A shows a schematic structure of one memory string 10 (here, the mn-th memory string) of the non-volatile semiconductor memory device 1 according to this embodiment. FIG. 11B is the equivalent circuit diagram thereof. In this embodiment, the memory string 10 includes four memory transistors MTr1*mn* to MTr4*nm* and two selection transistors SSTrmn and SDTrmn. With reference to FIGS. 11A and 11B, the four memory transistors MTr1*mn* to MTr4*nm* and the two selection transistors SSTrmn and SDTrmn are respectively connected in series. In one memory string 10 of the non-volatile semiconductor memory device 1 according to this embodiment, the semiconductor substrate has a p type region (p-well region) 14 formed therein, the p type region has an n+ type region 15 formed thereon, and the n+ type region 15 has a columnar semiconductor 11 formed thereon. The columnar semiconductor 11 has an insulating layer 12 formed therearound. The insulating layer 12 has a plurality of plate-like electrodes 13*a* to 13*f* formed therearound. The electrodes 13*b* to 13*e*, the insulating layer 12, and the columnar semiconductor 11 together provide the memory transistors MTr1*mn* to MTr4*nm*. Note that the insulating layer 12 is an insulating layer (such as a laminate of a silicon dioxide film, a silicon nitride film, and a silicon dioxide film) that functions as a charge accumulation layer. When, for example, the insulating layer 12 is a laminate of a silicon dioxide film, a silicon nitride film, and a silicon dioxide film, i.e., a so-called ONO film, a charge is held by traps discretely distributed in the silicon nitride film. The electrodes 13*b* to 13*e* correspond to the word-lines WL1 to WL4, respectively. The electrode 13*f* corresponds to the selection gate line SGDn. The electrode 13*a* corresponds to the selection gate line SGS. The selection transistor SDTrmn has source/drain electrodes. One of them is connected to a bit-line BLm. The selection transistor SSTrmn has source/drain electrodes. One of them is connected to a source line SL (the n+ type region 15 in this embodiment). Note that the charge accumulation layer may be formed only around the memory transistors MTr1*mn* to MTr4*nm* of the columnar semiconductor layer 11 (i.e., may be localized between the columnar semiconductor layer 11 and the electrodes 13*b* to 13*e*).

Note that the charge accumulation layer may be embodied by a floating gate made of an electrical conductor. The electrical conductor is formed only between the columnar semiconductor 11 and each word-line WL. Formed between the electrodes 13*a* and 13*f* and the columnar semiconductor 11 is the insulating layer 12 that functions as the gate insulating layer.

Although in this embodiment, the memory string 10 includes four memory transistors MTr1*mn* to MTr4*nm*, the number of memory transistors in one memory string is not limited thereto, any number of memory transistors may be included in accordance with the memory capacitance.

The memory string 10 in this embodiment has a generally symmetrical shape around the central axis of the columnar semiconductor 11.

Figure 12:
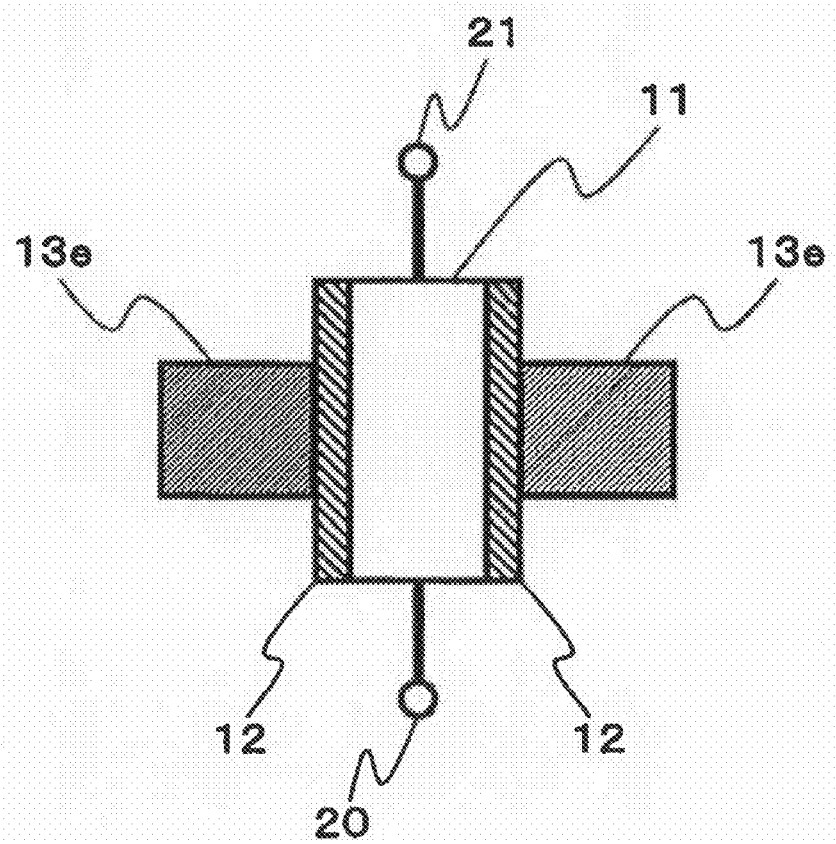
FIG. 12 is a schematic configuration diagram of a memory transistor MTr of a non-volatile semiconductor memory device according to the seventh embodiment of the present invention.

FIG. 12 is a cross-sectional structure diagram of one memory transistor MTr (such as the MTr4*nm*) of this embodiment. Note that each of the other memory transistors MTr1*mn* to MTr3*nm* has the same configuration as the memory transistor MTr4*nm*. In the memory transistor MTr4*nm*, the electrically conductive layer 13*e* encircling the columnar semiconductor 11 via the insulator 12 functions as the control gate electrode. The memory transistor MTr4 has a source electrode 20 and a drain electrode 21, which are formed on the columnar semiconductor 11. Note, however, that when the memory transistor MTr1*mn* and the selection gate transistors SSTrmn and SDTrmn each have a depression-type transistor structure, the semiconductor 11 may not have distinct source/drain diffusion layers. A so-called enhancement type transistor may also be formed. The enhancement type transistor includes, in the columnar semiconductor 11, an area generally enclosed by the electrically conductive layer 13*e* as a p type semiconductor, and an area generally not enclosed by the electrically conductive layer 13*e* as an n type semiconductor.

Although FIGS. 11A, 11B, and 12 illustrate one memory string 10, in the non-volatile semiconductor memory device according to this embodiment, all memory strings have the same configuration.

[Operations]

First, with reference to FIGS. 11A and 11B, a description will be given of "read operation," "write operation," and "erase operation" in the memory transistors MTr1*mn* to MTr4*nm* in one memory string 10 according to this embodiment. Note that the "read operation" and "write operation" will be described with respect to the memory transistor MTr3*nm*.

Each of the memory transistors MTr1*mn* to MTr4*nm* in this embodiment is a so-called MONOS type vertical transistor. The transistor includes the semiconductor 11, the insulating layer (a laminate of the silicon dioxide film, the silicon nitride film, and the silicon dioxide film) that functions as the charge accumulation layer, and the electrically conductive layer (a polysilicon layer in this embodiment). It is assumed here that when no electrons are accumulated in the charge accumulation layer, the memory transistor MTr has a threshold voltage Vth (hereinafter referred to as a "neutral threshold") around 0 V.

[Read Operation]

In reading data from the memory transistor MTr3*nm*, the bit-line BLm is applied with a voltage Vbl (for example 0.7 V), the source line SL is applied with 0 V, the selection gate lines SGD and SGS are applied with a voltage Vdd (for example 3.0 V), and the p-well region is applied with a voltage VPW (for example 0 V). The bit (MTr3*nm*) to be read connects to the word-line WL3. The word-line WL3 is then set to 0 V. The other word-lines WL are set to a voltage Vread (for example 4.5 V). Whether or not the threshold voltage Vth of the bit (MTr3*nm*) to be read is larger than 0 V determines whether or not a current flows through the bit-line BLm. The current through the bit-line BLm may thus be sensed to read data information of the bit (MTr3*nm*). Note that a similar operation may be used to read data of the other bits (the memory transistors MTr1*mn*, MTr2*nm*, and MTr4*nm*).

[Write Operation]

In writing data "0" to the memory transistor MTr3*nm*, specifically, injecting electrons into the charge accumulation layer of the memory transistor MTr3*nm* to increase the threshold voltage of the memory transistor (shift the threshold voltage in the positive direction), voltages are applied to the lines and areas as follows. The bit-line BLm is applied with 0 V. The source line SL is applied with a voltage Vdd. The selection gate line SGDn is applied with a voltage Vdd (for example 3.0 V). The selection gate line SGS is applied with a voltage Voff (for example 0 V). The p-well region 14 is applied with a VPW (for example 0 V). The word-line WL3 of the bit (MTr3) to be written is then set to a Vprog (for example 18V). The voltages of the other word-lines WL are set to a Vpass (for example 10 V). The threshold voltage of the memory transistor MTr3*nm* is thus shifted in the positive direction.

In writing data "1" to the memory transistor MTr3*nm*, specifically, not increasing the threshold voltage from the erase state of the memory transistor MTr3*nm* (not injecting electrons into the charge accumulation layer), the bit-line BLm is applied with a voltage Vdd. In the selection transistor SDTrmn, therefore, the gate and the source have the same potential. The selection transistor SDTrmn thus turns off. The potential difference is therefore reduced between the channel-forming area (body portion) of the memory transistor MTr3*nm* and the word-line WL3. No electrons are thus injected into the charge accumulation layer of the memory transistor MTr3*nm*. Note that a similar operation may be used to write data to the other bits (the memory transistors MTr1*mn*, MTr2*nm*, and MTr4*nm*).

[Erase Operation]

In erasing data, data of the memory transistors MTr1*mn* to MTr4*nm* is erased in units of a block including the multiple memory strings 10.

In the selected block (the block to erase), the p-well region is applied with a voltage Verase (for example 20 V), the source line SL is electrically floated, and the p-well region is applied with a voltage Verase. With a slight time shift (for example about 4 μsec shift) from this, the selection gate lines SGS and SGDn are increased in potential (for example by 15 V). A gate induced drain leak (GIDL) current thus occurs around the gate edges of the selection transistor SSTrmn. The generated holes then flow into the portions of the semiconductor layer 11 that correspond to the body portions of the memory transistors MTr1*m* to MTr4*nm*. The electrons flow in the direction of the p-well region 14. A potential close to the Verase is thus transferred in the channel-forming region (body portion) of the memory transistor MTr. When, therefore, the word-lines WL1 to WL4 are set to, for example, 0 V, the electrons of the charge accumulation layer of the memory transistors MTr1*mn* to MTr4*nm* are pulled to the p-well. Data of the memory transistors MTr1*mn* to MTr4*nm* may thus be erased.

In erasing data of the memory transistors in the selected block, the word-lines WL1 to WL4 are electrically floated in the unselected blocks. Therefore, in coupling with the potential increase of the channel-forming regions (body portions) of the memory transistors MTr1*mn* to MTr4*nm*, the potentials of the word-lines WL1 to WL4 increase. Because no potential difference occurs between the word-lines WL1 to WL4 and the charge accumulation layers of the memory transistors MTr1*mn* to MTr4*nm*, respectively, no electrons are pulled (erased) from the charge accumulation layer.

Figure 13:
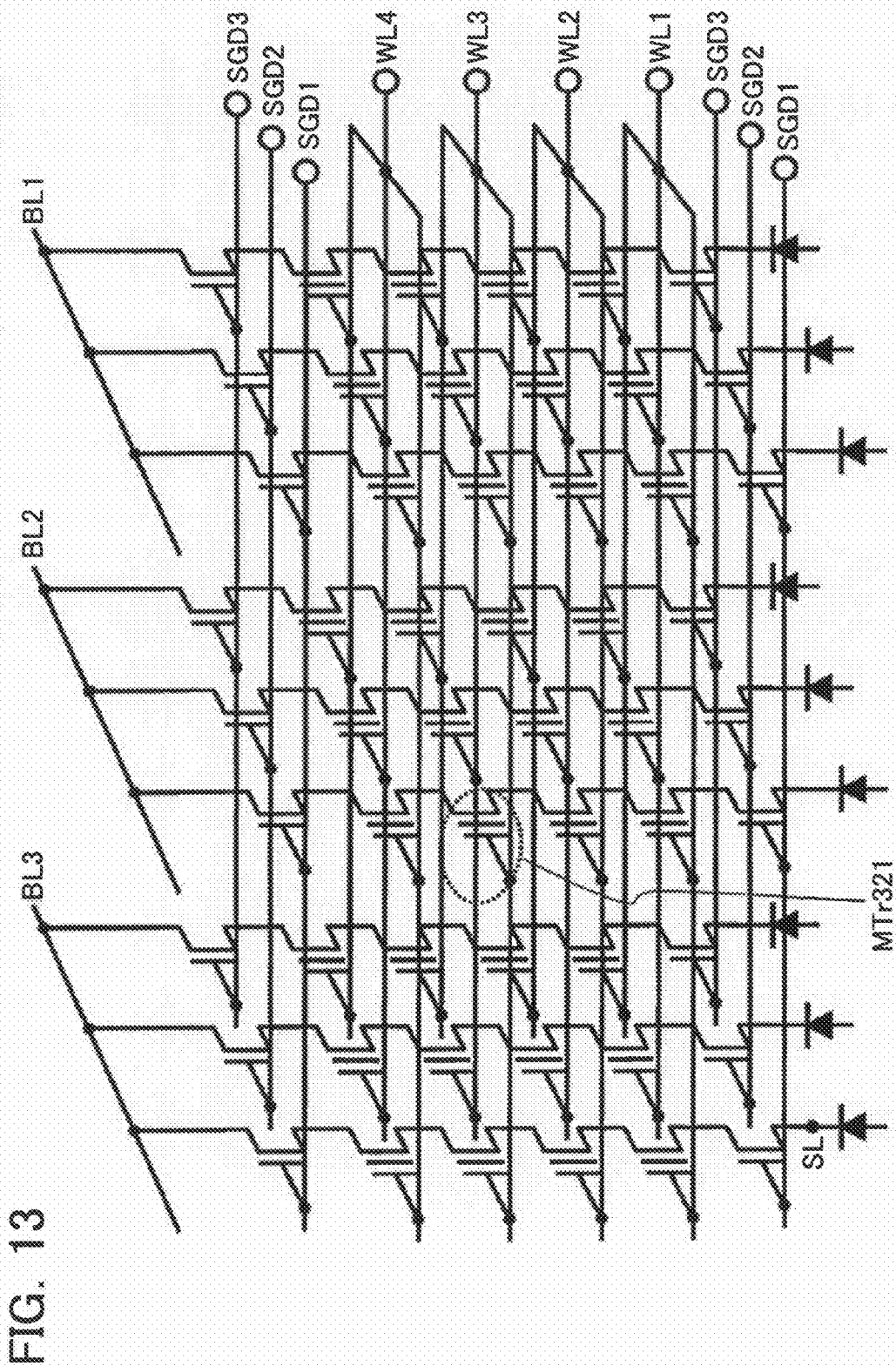
FIG. 13 is an equivalent circuit diagram of the non-volatile semiconductor memory device shown in FIG. 10.

A description is now given of the "read operation," "write operation," and "erase operation" of the non-volatile semiconductor memory device 1 according to this embodiment. The non-volatile semiconductor memory device 1 includes the memory strings 10 arranged two-dimensionally in all directions on the substrate surface. FIG. 13 is an equivalent circuit diagram of the non-volatile semiconductor memory device 1 according to this embodiment. In the non-volatile semiconductor memory device 1 according to this embodiment, each of the word-lines WL1 to WL4 provides the same potential to the memory strings 10, as described above. In FIG. 13, each of the selection gate lines SGS1 to SGS3 is adapted to be independently controllable. Alternatively, the selection gate lines SGS1 to SGS3 may be made of the same electrically conductive layer or the like to be set to the same potential, and the potential may be controlled.

A description is given here of the "read operation" and "write operation" of a memory transistor MTr321 (which is an MTr3 of a memory string connected to a bit-line BL2 and selection gate lines SGS1 and SGD1) denoted by the dotted line. The "erase operation" of the memory transistor will also be described.

[Read Operation]

Figure 14:
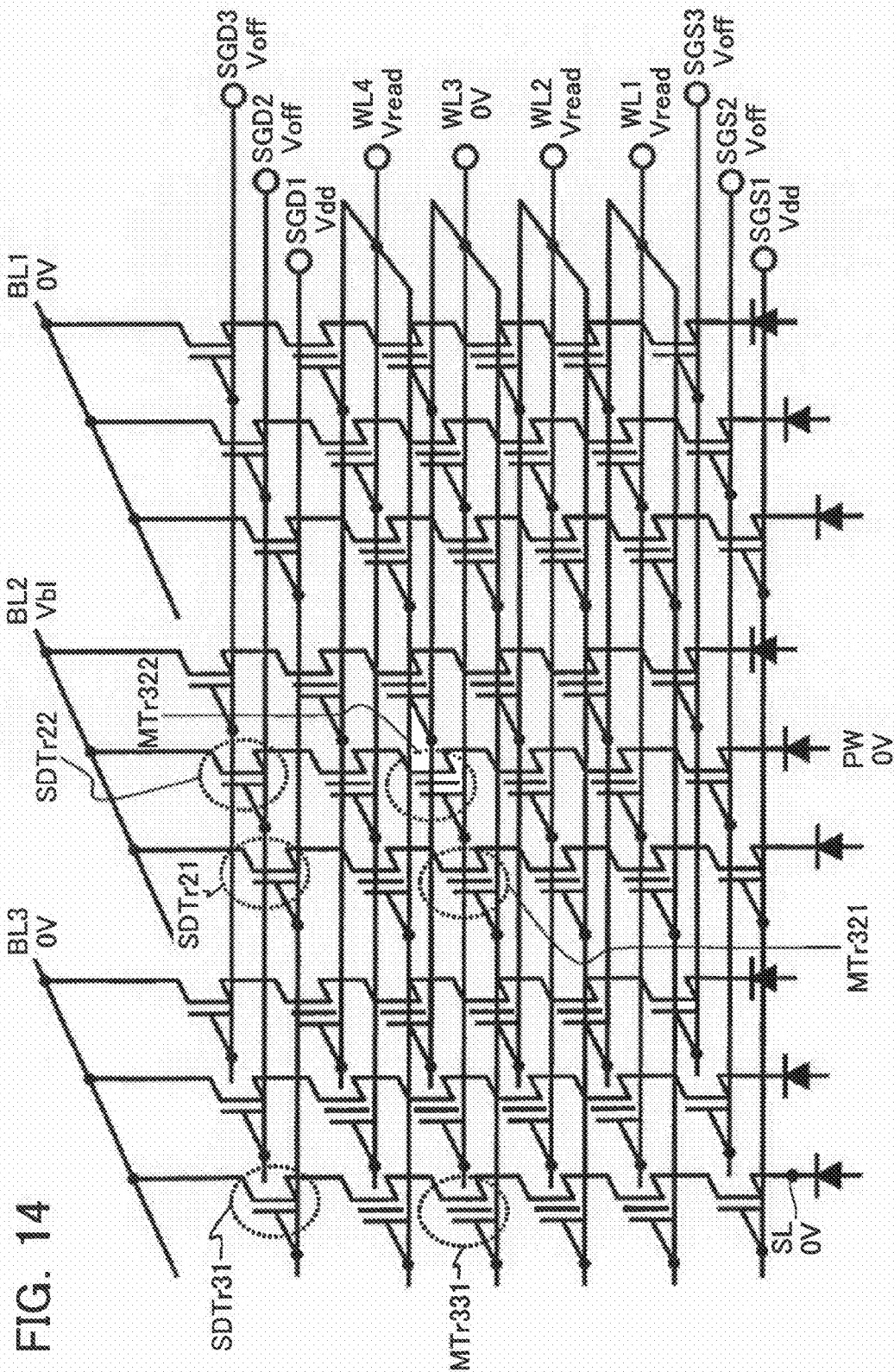
FIG. 14 is a state diagram of the read operation of a non-volatile semiconductor memory device.

FIG. 14 shows a bias condition of the non-volatile semiconductor memory device 1 according to this embodiment in reading data from the memory transistor MTr321 denoted by the dotted line. Again, the memory transistor MTr of this embodiment is a so-called MONOS type vertical transistor. The transistor includes the semiconductor 11, the insulating layer (a laminate of a silicon dioxide film, a silicon nitride film, and a silicon dioxide film) that functions as the charge accumulation layer, and the electrically conductive layer (a polysilicon layer in this embodiment). It is again assumed here that when no electrons are accumulated in the charge accumulation layer, the memory transistor MTr has a threshold voltage Vth (hereinafter referred to as a "neutral threshold") around 0 V.

In reading data from the memory transistor MTr321, voltages are applied to the lines and areas as follows. The bit-line BL2 to which the memory transistor MTr321 is connected is applied with a voltage Vbl (for example 0.7 V). The other bit-lines BL are applied with 0 V. The source line SL is applied with 0 V. The selection gate lines SGD1 and SGS1 to which the memory transistor MTr321 is connected is applied with a voltage Vdd (for example 3.0 V). The other selection gate lines SGD and SGS are applied with a voltage Voff (for example 0 V). The p-well region (PW) is applied with a voltage VPW (for example 0 V, the VPW may be any potential that does not allow the p-well region 14 or the memory string 10 to be forward biased).

The bit (MTr321) to be read connects to the word-line WL3. The word-line WL3 is then set to 0 V. The other wordlines WL are set to a voltage Vread (for example 4.5 V). A potential difference thus occurs between the bit-line BL3 of the bit (MTr321) whose data is read and the source line SL, and a selection transistor connected to the selection gate line SGD1 is turned on. Whether or not the threshold voltage Vth of the bit (MTr321) to be read is larger than 0 V determines whether or not a current flows through the bit-line BL2. The current through the bit-line BL2 may thus be sensed to read data information of the bit (MTr321).

Note that a similar operation may be used to read data of the other bits (the memory transistors MTr1*mn*) Regardless of the threshold voltage Vth of the memory transistor MTr322 (in other words, whether the memory transistor MTr322 is written with "1" or "0"), for example, no current flows through the memory transistor MTr322 and the memory string 10 to which the memory transistor MTr322 belongs because the selection gate line SGD2 is at Voff. The same holds true for all memory strings 10 that are connected to the bit-line BL2 and not connected to the selection gate line SGD1.

For the memory string 10 to which the memory transistor MTr331 belongs, for example, regardless of the threshold voltage Vth of the memory transistor MTr331, in other words, whether the memory transistor MTr331 is written with "1" or "0," no current flows through the bit-line BL3 because the bit-line BL3 is at 0 V, which is the same potential as that of the source line SL. The same holds true for all memory strings 10 that are not connected to the bit-line BL2.

Thus, in the non-volatile semiconductor memory device 1 according to this embodiment, even when the word-lines WL1 to WL4 are driven at the common potential and the selection gate lines SGS1 to SGS3 are driven at the common potential, threshold voltage data of any bit may be read.

[Write Operation]

Figure 15:
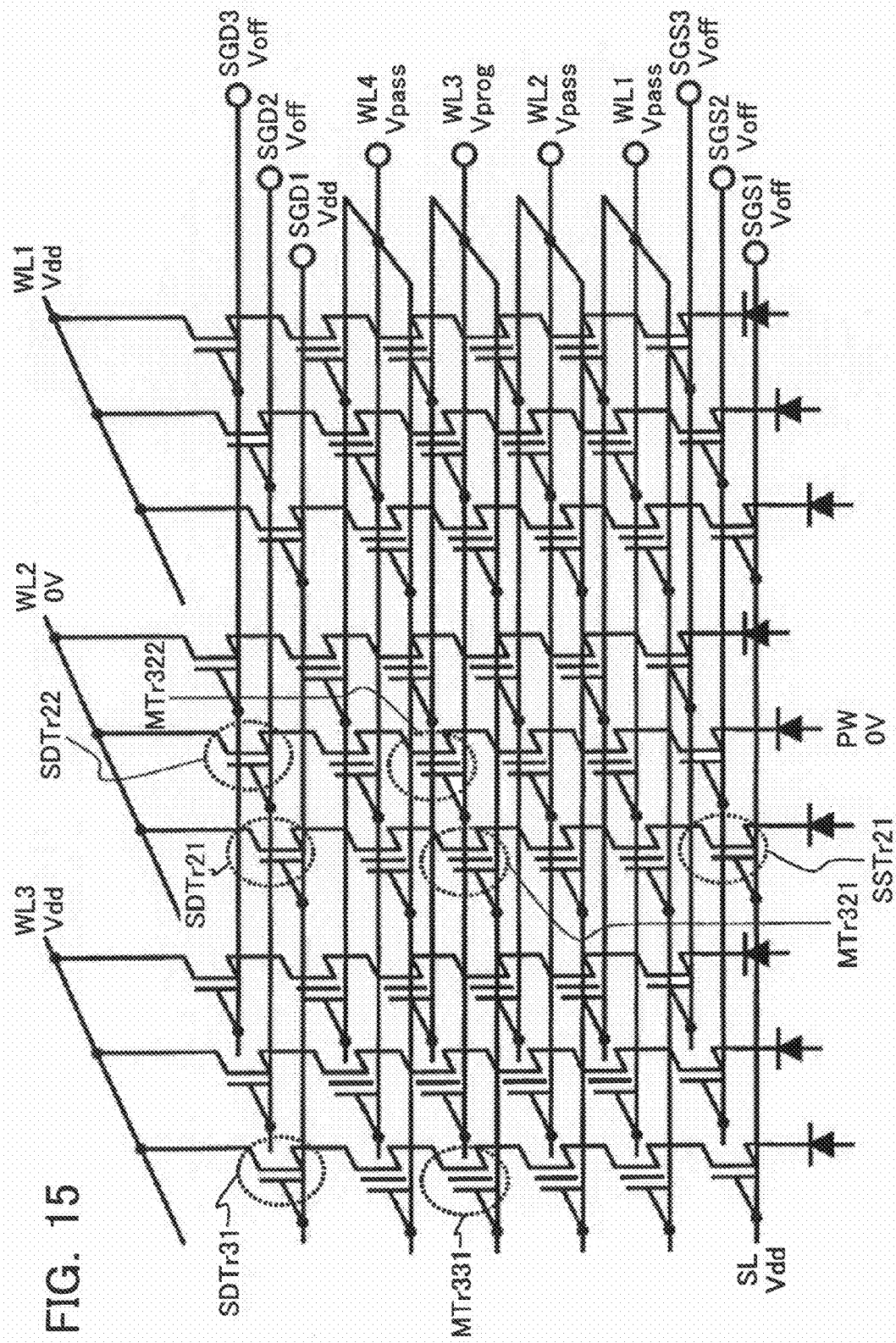
FIG. 15 is a state diagram of the write operation of a non-volatile semiconductor memory device.

FIG. 15 shows a bias condition of the non-volatile semiconductor memory device 1 according to this embodiment in writing data to the memory transistor MTr321 denoted by the dotted line.

A description is given of writing data "0" to the memory transistor MTr3 (specifically, injecting electrons into the charge accumulation layer of the memory transistor MTr321 to shift the threshold voltage of the memory transistor in the positive direction). Voltages are then applied to the lines and areas as follows. The bit-line BL2 to which the memory transistor MTr321 is connected is applied with 0 V. The other bit-lines BL are applied with a voltage Vdd. The source line SL is applied with a voltage Vdd. The selection gate line SGD1 to which the selection gate transistor SDTr21 is connected is applied with a voltage Vdd. The other selection gate lines SGD are applied with a voltage Voff. The selection gate lines SGS1 to SGS3 are applied with a voltage Voff. The p-well region (PW) is applied with a voltage VPW (for example 0 V). The word-line WL3 of the bit (MTr321) to be written is set to Vprog (for example 18V). The other wordlines WL are set to Vpass (for example 10 V). In the memory string 10 to which the memory transistor MTr321 belongs, therefore, a channel is formed in all memory transistors MTr121, MTr221, MTr321, and MTr421 except the selection gate transistor SSTr21 to which the source selection gate line SGS1 is connected. The potential (0 V) of the bit-line BL2 is thus propagated in the channel. A higher electric field is thus applied to the ONO film including the charge accumulation layer between the word-line WL of the desired bit (MTr321) and the columnar semiconductor 11. Electrons are thus injected into the charge accumulation layer, shifting the threshold voltage of the memory transistor MTr321 in the positive direction.

In the memory transistor MTr322, for example, the source selection gate line SGD2 is applied with the voltage Voff, and so the potential of the bit-line BL2 is not propagated in the channel portion of the memory transistor MTr322. Electrons are thus not injected into the memory transistor MTr322. The same holds true for all memory strings 10 that are connected to the BL2 and to which the memory transistor MTr321 does not belong.

For the memory string 10 to which the memory transistor MTr331 belongs, for example, the selection transistor SDTr31 to which the selection gate line SGD1 is connected has a source-side potential of Vdd and the bit-line BL3 has a potential of Vdd, and so the source and the gate of the selection transistor SDTr31 have the same potential. The selection transistor SDTr31 thus does not turn on, and the external potential does not propagate in the channel portion of the memory transistor MTr331. No electrons are thus injected. The same holds true for all memory strings 10 that are not connected to the BL2.

When data "1" is written to the memory transistor MTr321, specifically, the threshold voltage is not increased from the erase state of the memory transistor MTr321 (no electrons are injected into the charge accumulation layer), the operation is as follows. The bit-line BL2 is applied with Vdd, keeping the gate and the source of the selection transistor SDTr21 at the same potential. The selection transistor SDTr21 is thus turned off, thereby reducing the potential difference between the channel-forming region (body portion) of the memory transistor MTr3 and the word-line WL3. No electrons are thus injected into the charge accumulation layer of the memory transistor MTr321. Note that a similar operation may be used to write data of the other bits (the memory transistors MTr1mn; in the example shown in FIG. 15, l is 1 to 4, m is 1 to 3, and n is 1 to 3).

Each bit-line BL may be appropriately set to a potential of 0 V or Vdd, allowing the bits (MTr) on a common word-line WL selected by a certain selection gate line SGD to be written at the same time, i.e., to be page written.

[Erase Operation]

Figure 16:
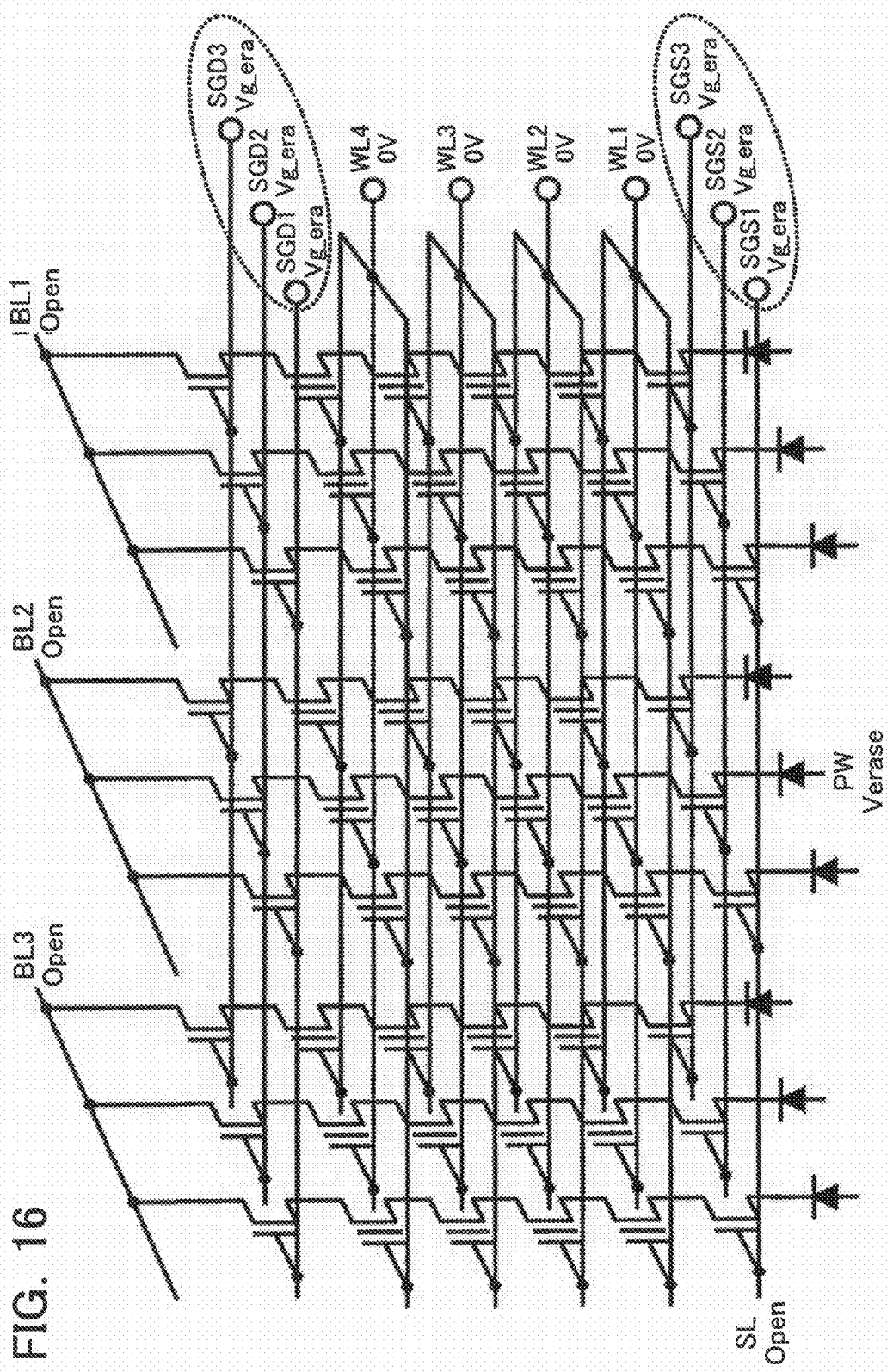
FIG. 16 is a state diagram of a selected block in the erase operation of a non-volatile semiconductor memory device.
Figure 17:
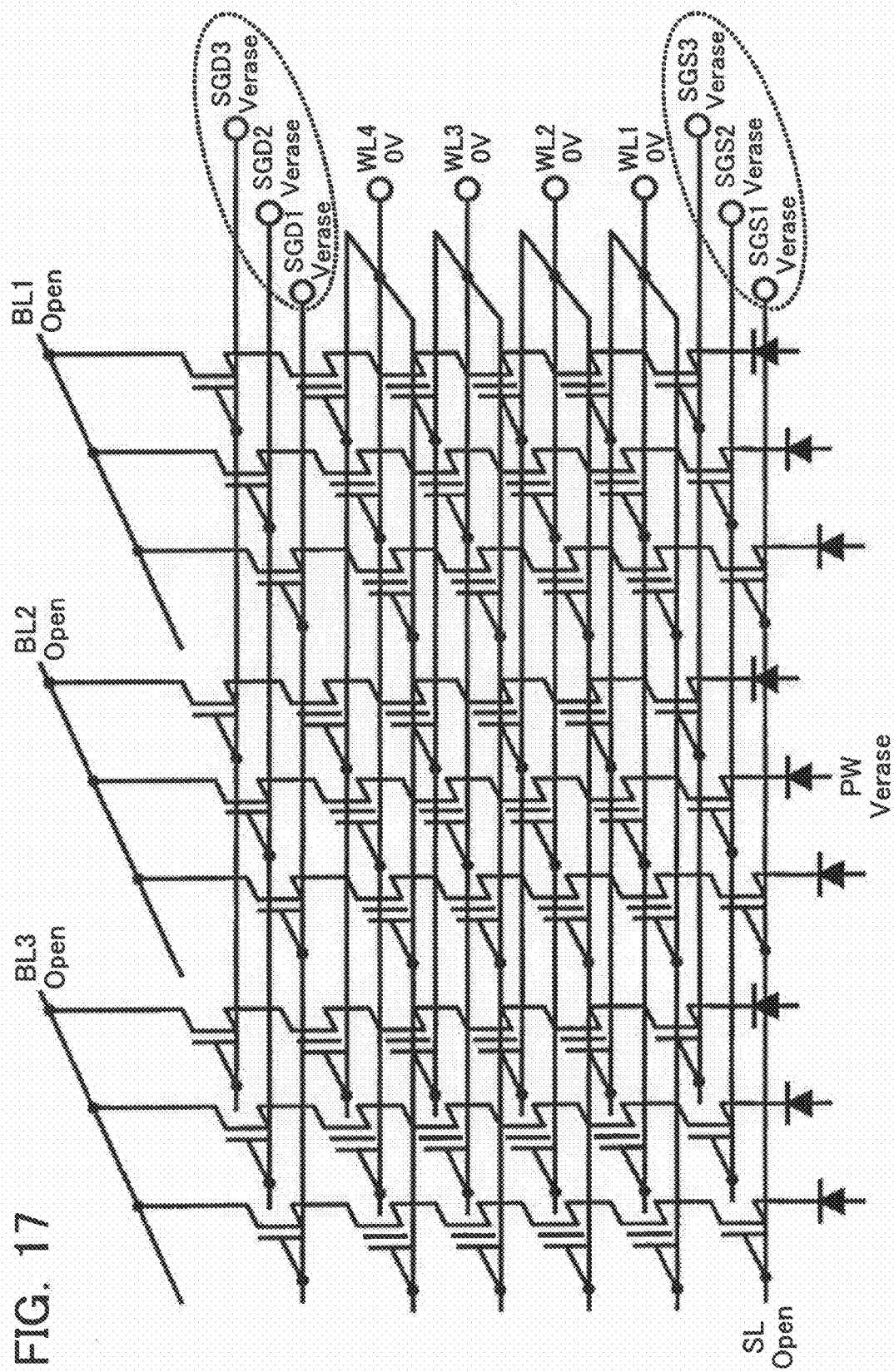
FIG. 17 is a state diagram of an unselected block in the erase operation of a non-volatile semiconductor memory device.

In erasing data, data of the memory transistor MTr is erased in units of a block including the multiple memory strings. FIGS. 16 and 17 show bias conditions of the non-volatile semiconductor memory device according to this embodiment in erasing data of the memory transistor MTr in the selected block.

In the selected block (the block to erase), the p-well region (PW) is applied with Verase (for example 20 V), the source line SL is electrically floated, and the selection gate lines SGS and SGD are increased in potential (for example by 15 V) with a slight time shift (for example about 4 μsec shift) from when the p-well region is applied with Verase. A gate induced drain leak (GIDL) current thus occurs around the gate edges of the selection transistor SSTrmn. The generated holes then flow into the portion of the semiconductor layer 11 that corresponds to the body portion of the memory transistor MTr. The electrons flow in the p-well direction. A potential close to Verase is thus transferred in the channel-forming region (body portion) of the memory transistor MTr. When, therefore, the word-lines WL1 to WL4 are set to, for example, 0 V, electrons of the charge accumulation layer of the memory transistor MTr are pulled to the p-well, thereby erasing data.

In erasing data of the memory transistor in the selected block, the word-lines WL1 to WL4 are electrically floated in the unselected blocks. Therefore, in coupling with the potential increase of the channel-forming regions (body portions) of the memory transistors MTr1 toMTr4, the potentials the word-lines WL1 to WL4 increase. No potential difference thus occurs between the word-lines WL1 to WL4 and the charge accumulation layers of the memory transistors MTr1 to MTr4, respectively. No electrons are therefore pulled (erased) from the charge accumulation layers.

Figure 18:
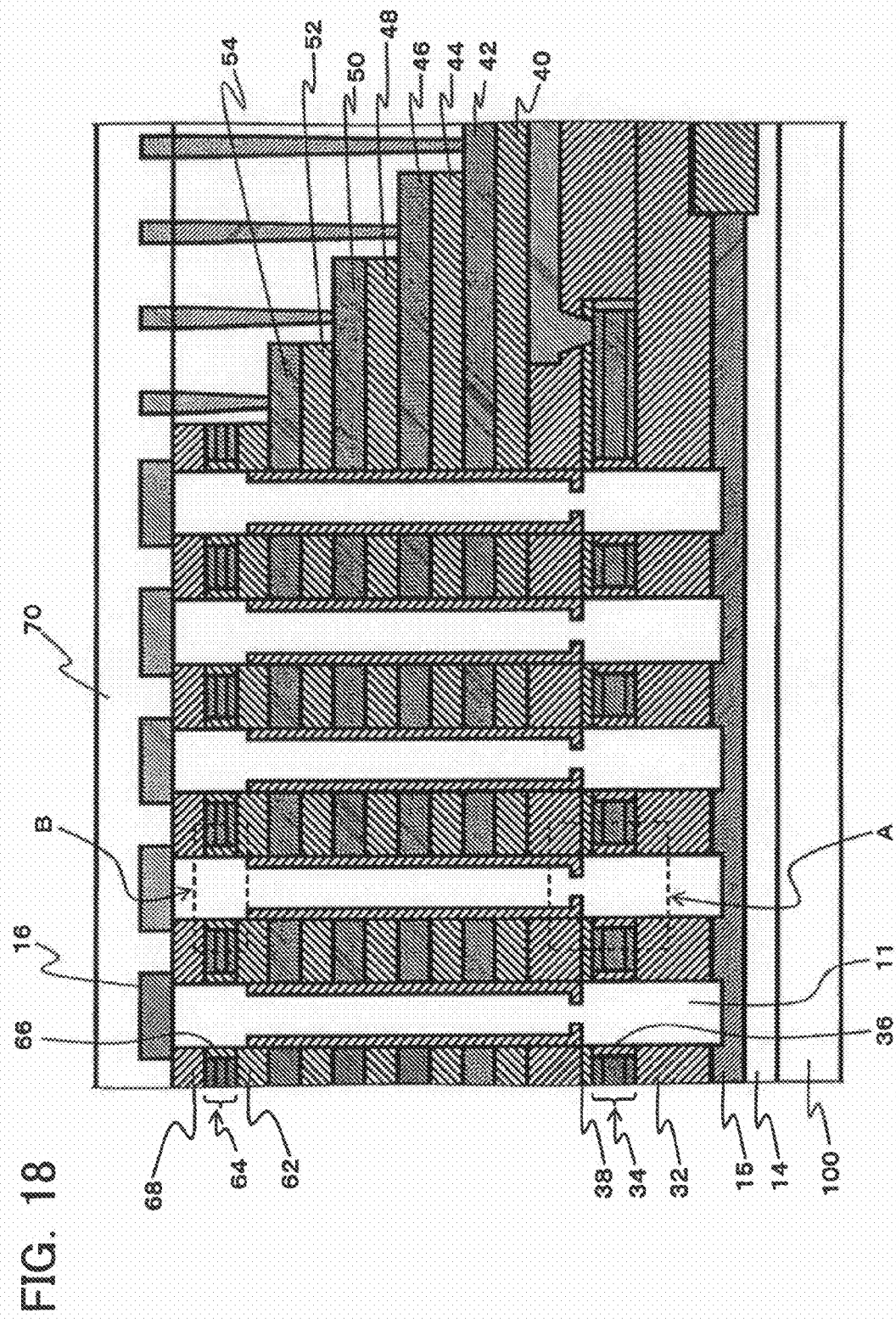
FIG. 18 is a cross sectional view of a non-volatile semiconductor memory device according to the seventh embodiment of the present invention.

With reference to FIG. 18, the configuration of the non-volatile semiconductor memory device according to this embodiment of the present invention will be described.

The non-volatile semiconductor memory device according to this embodiment includes a semiconductor substrate 100 such as a silicon (Si) substrate. The substrate 100 is implanted with impurity ions such as boron (B) to form the p-well region 14. The substrate 100 is then implanted with impurity ions such as phosphorous (P) to form the n+ type region 15. An amorphous silicon layer is then formed on the n+ type region 15 as the columnar semiconductor layer 11.

The n+ type region 15 has thereon, via a not-shown nitride silicon (SiN) film, a laminate of a boron phospho silicate glass (BPSG) film 32, a source selection gate laminate film 34 including impurity doped silicon, and a nitride silicon (SiN) film 38, which are deposited in this order. In the region of the source selection gate laminate film 34 that is in contact with the columnar semiconductor layer 11, a thermally-oxidized silicon film 36 is formed. The source selection gate laminate film 34 includes a laminate of two or more layers having different work functions. In this embodiment, the film 34 includes a laminate of three layers.

The nitride silicon (SiN) film 38 has thereon, via an interlayer dielectric film, a laminate of alternating silicon oxide layers 40, 44, 48, and 52 and p+ type polysilicon films 42, 46, 50, and 54 (which correspond to 13b, 13c, 13d, and 13e in FIG. 11A, respectively). The p+ type polysilicon films work as the gate electrodes. The p+ type polysilicon films 42 (13b), 46 (13c), 50 (13d), and 54 (13e) provide the word-lines WL1, WL2, WL3, and WL4, respectively. Each of the word-lines WL1, WL2, WL3, and WL4 may include a laminate of two or more layers having different work functions.

The n+ type polysilicon film 54 (13e) has thereon a laminate of a silicon oxide layer 62, a drain-side selection gate laminate film 64 including impurity doped silicon, and a nitride silicon (SiN) film 68. In the area of the drain side selection gate laminate film 64 that is in contact with the columnar semiconductor layer 11, a thermally-oxidized silicon film 66 is formed. The drain-side selection gate laminate film 64 includes a laminate of two or more layers having different work functions. In this embodiment, the film 64 includes a laminate of three layers.

The columnar semiconductor layer 11 has thereon an electrode 105 (corresponding to the electrode 16 in FIG. 11A) that provides a bit-line. The layer 11 also has a boron phospho silicate glass (BPSG) film 72 formed across its surface.

One memory string 10 includes two transistors formed therein: a drain-side selection transistor formed in the area enclosed by the broken line B and a source selection transistor formed in the area enclosed by the broken line A. Each of the two selection transistors includes any of the transistors according to the first to sixth embodiments or the transistor according to the seventh embodiment. In this embodiment, it is required that the memory strings arranged in a matrix in a block is selected by a selection transistor that is excellent in, for example, cut-off characteristics than the conventional flat flash memories. Specifically, in view of the number of transistors connected to one source line, the flat flash memory includes selection transistors that are aligned in a line and are one-dimensionally arranged, this embodiment includes selection transistors that are two-dimensionally arranged in the plane-like source line. This may very advantageously increase the storage capacity. Because, however, more memory strings are connected, each selection transistor should have improved cut-off characteristics. Otherwise, a considerable amount of leak current may flow through a large number of unselected memory transistors that are two-dimensionally arranged. In view thereof, this embodiment includes a laminated gate insulating layer as in the foregoing embodiments, thereby allowing for more precise control of the leak current. This may thus extremely effectively improve the cut-off characteristics of the transistors that are two-dimensionally arranged on the flat plate-like (plane-like) electrode.

Note that the present invention is not limited to the disclosed embodiments, and modified components may be implemented without departing from the spirit of the present invention. Specifically, the amorphous silicon layer 103 may not be formed in an amorphous state, but may be formed in a single crystal state or a polycrystalline state. The upper-layer electrode layer, the intermediate-layer electrode layer, and the lower-layer electrode layer, which are included in the gate electrode, may be made of an impurity-implanted semiconductor such as silicon, and also be made of any electrically conductive materials such as metal and metal compound. This permits a wider range of work functions, thereby providing a higher withstand voltage to the cylindrical-structure transistor (SGT). The cylindrical-structure transistors may be laminated to form a logic device or a memory cell. Preferably, each of the upper-layer electrode layer, the intermediate-layer electrode layer, and the lower-layer electrode layer in this embodiment is an impurity doped semiconductor material with a concentration of $1\times10^{18}$ [cm$^{-3}$] or less. This is because the gate electrode including these electrode layers may be depressed and the drain-edge electric field may be reduced at an impurity concentration of $1\times10^{18}[cm^{-3}]$ or less.

Thus, the plurality of components disclosed in the above embodiments may be appropriately combined to provide various embodiments of the present invention. For example, some of the components disclosed in the above embodiments may be deleted. In addition, common components in different embodiments may be appropriately added and combined.

What is claimed is:

1. A non-volatile semiconductor memory device comprising:
   a memory string comprising a plurality of non-volatile memory cells connected in series, a drain-side selection transistor having one end connected to one end of the memory string, and a source-side selection transistor having one end connected to another end of the memory string, a bit line connected to another end of the drain-side selection transistor, a source line connected to another end of the source-side selection transistor;
   a substrate having a conductive layer as the source line formed on its surface;
   a plurality of columnar semiconductor layers formed on the substrate conductive layer and perpendicular to the substrate, each of the columnar semiconductor layers serving as a body of the memory string;
   an insulating layer formed around the columnar semiconductor layers, the insulating layer serving as a gate insulating film of the non-volatile memory cells, the drain-side selection transistor and the source-side selection transistor; and
   a plurality of electrode films formed around the insulating layer, the electrode films functioning as a gate electrode of the non-volatile memory cells, the drain-side selection transistor and the source-side selection transistor,
   a plurality of memory strings being connected to one bit line,
   the electrode films that serve as gate electrodes of the drain-side selection transistor and the source-side selection transistor comprising an laminate of two or more conductive films having different work functions, the work functions being set such that an inversion layer is formed under an edge of the gate electrode with a first voltage applied thereto, and an inversion layer is formed under the center of the gate electrode with a second voltage applied thereto, the absolute value of the first voltage being smaller than that of the second voltage.

2. The semiconductor device according to claim 1, wherein the two or more conductive films are semiconductor layers having different impurity concentrations.

3. The semiconductor device according to claim 1, wherein the two or more conductive films are semiconductor layers of different conductivity types.

4. The semiconductor device according to claim 1, further comprising an interlayer dielectric film formed between the conductive films.

5. The semiconductor device according to claim 4, wherein the interlayer dielectric film is a silicon nitride film.

6. The semiconductor device according to claim 4, wherein the interlayer dielectric film comprises a laminate of a silicon oxide layer and a silicon nitride film.

7. The semiconductor device according to claim 1, wherein a plurality of the columnar semiconductor layers are provided while the conductive layer is provided in a plane-like structure, and the columnar semiconductor layers are two-dimensionally arranged on the conductive layer.

8. The semiconductor device according to claim 1, further comprising a through-hole penetrating the two or more conductive films, the through-hole being provided with a through-electrode that electrically connects to the conductive film.

9. The semiconductor device according to claim 1, further comprising a first diffusion region comprising impurities diffused from the conductive layer into the columnar semiconductor layers, the first diffusion region being formed to have its upper surface reaching above a lower surface of the gate electrode provided immediately above the substrate.

10. The semiconductor device according to claim 8, further comprising a second diffusion region comprising impurity ions implanted into the columnar semiconductor layers, the second diffusion region being formed in an region overlapping an upper surface of the gate electrode.

11. The semiconductor device according to claim 1, wherein each of the columnar semiconductor layers further comprises source/drain diffusion regions of N type,
   wherein each of the electrode films has a lower work function in the vicinity of the source/drain diffusion regions than in the center thereof.

* * * * *